(12) United States Patent
Inoue et al.

(10) Patent No.: US 8,609,442 B2
(45) Date of Patent: Dec. 17, 2013

(54) VAPOR DEPOSITION METHOD, VAPOR DEPOSITION DEVICE AND ORGANIC EL DISPLAY DEVICE

(75) Inventors: Satoshi Inoue, Osaka (JP); Shinichi Kawato, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/824,859

(22) PCT Filed: Oct. 11, 2011

(86) PCT No.: PCT/JP2011/073341
§ 371 (c)(1),
(2), (4) Date: Mar. 18, 2013

(87) PCT Pub. No.: WO2012/056877
PCT Pub. Date: May 3, 2012

(65) Prior Publication Data
US 2013/0196454 A1    Aug. 1, 2013

(30) Foreign Application Priority Data

Oct. 29, 2010  (JP) ................. 2010-243646

(51) Int. Cl.
| | | |
|---|---|---|
| H01L 21/00 | (2006.01) | |
| G01R 31/26 | (2006.01) | |
| H01L 29/08 | (2006.01) | |
| H01L 23/58 | (2006.01) | |
| C23C 16/00 | (2006.01) | |
| B05C 11/00 | (2006.01) | |

(52) U.S. Cl.
USPC ...... 438/5; 427/248.1; 427/255.5; 427/255.6; 118/663; 118/669; 118/729; 118/665; 438/16; 438/7; 257/40; 257/642; 257/E21.529

(58) Field of Classification Search
USPC ......... 118/663–666, 669, 679, 680, 688, 712, 118/715, 720, 723, 728–730; 257/40, 642, 257/E21.521–E21.531; 427/248.1, 255.5, 427/251, 255.6; 438/5–18, 98, 99, 681
See application file for complete search history.

(56) References Cited

U.S. PATENT DOCUMENTS

| | | |
|---|---|---|
| 5,742,129 A | 4/1998 | Nagayama et al. |
| 6,294,892 B1 | 9/2001 | Utsugi et al. |
| 2003/0232563 A1 | 12/2003 | Kamiyama et al. |
| 2004/0115338 A1* | 6/2004 | Yoneda .......................... 427/66 |
| 2007/0178708 A1 | 8/2007 | Ukigaya |

FOREIGN PATENT DOCUMENTS

| | | |
|---|---|---|
| JP | 8-227276 A | 9/1996 |
| JP | 2000-188179 A | 7/2000 |

(Continued)

OTHER PUBLICATIONS

International Search Report received for PCT Patent Application No. PCT/JP2011/073341 mailed on Nov. 22, 2011, 4 pages (1 page of English Translation and 3 pages of PCT Search Report).

Primary Examiner — Julio J Maldonado
Assistant Examiner — Cory Eskridge
(74) Attorney, Agent, or Firm — Morrison & Foerster LLP

(57) ABSTRACT

A coating film (90) is formed by causing vapor deposition particles (91) discharged from a vapor deposition source opening (61) of a vapor deposition source (60) to pass through a space between a plurality of control plates (81) of a control plate unit (80) and a mask opening (71) of a vapor deposition mask in this order and adhere to a substrate, while the substrate (10) is moved relative to the vapor deposition mask (70) in a state in which the substrate (10) and the vapor deposition mask (70) are spaced apart at a fixed interval. A difference in the amount of thermal expansion between the vapor deposition source and the control plate unit is detected and corrected. It is thereby possible to form, at a desired position on a large-sized substrate, the coating film in which edge blur and variations in the edge blur are suppressed.

20 Claims, 16 Drawing Sheets

(56) References Cited

FOREIGN PATENT DOCUMENTS

| JP | 2003-157973 | A | 5/2003 |
| JP | 2007-227359 | A | 9/2007 |
| JP | 2008-208443 | A | 9/2008 |
| JP | 2010-242116 | A | 10/2010 |

* cited by examiner

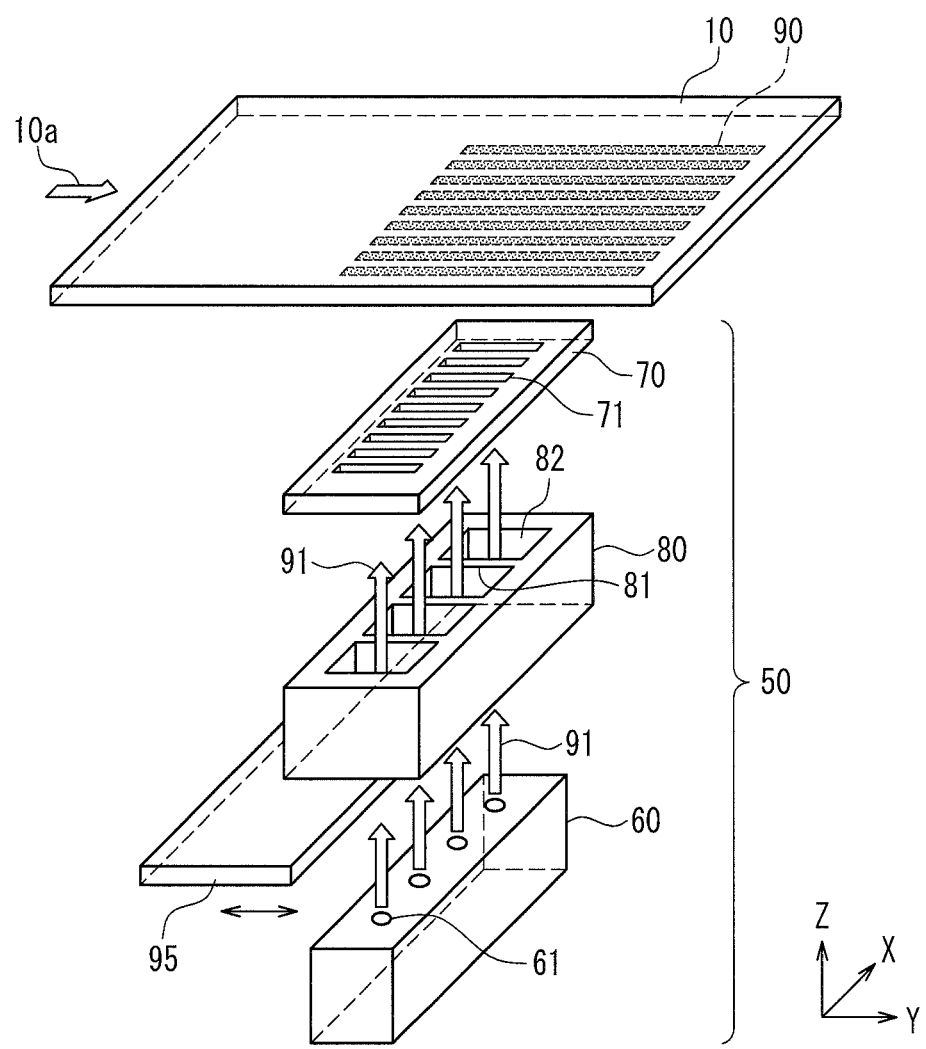
F I G. 11

VAPOR DEPOSITION METHOD, VAPOR DEPOSITION DEVICE AND ORGANIC EL DISPLAY DEVICE

CROSS REFERENCE TO RELATED APPLICATIONS

This is a U.S. National Phase patent application of PCT/JP2011/073341, filed Oct. 11, 2011, which claims priority to Japanese Patent Application No. 2010-243646, filed Oct. 29, 2010, each of which is hereby incorporated by reference in the present disclosure in its entirety.

TECHNICAL FIELD

The present invention relates to a vapor deposition method and a vapor deposition device for forming a coating film having a predetermined pattern on a substrate. The present invention also relates to an organic EL (Electro Luminescence) display device including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are laminated between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a thin film is formed. Vapor deposition is performed for each color of the light emitting layer, which is referred to as "vapor deposition by color".

For example, Patent Documents 1 and 2 disclose a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

CITATION LIST

Patent Document

Patent Document 1: JP H8-227276A
Patent Document 2: JP 2000-188179A

DISCLOSURE OF INVENTION

Problem to be Solved by the Invention

With conventional methods for performing vapor deposition by color as described above, as the substrate becomes larger, the mask needs to be large accordingly. However, when the mask is made large, a gap is likely to appear between the substrate and the mask by the mask being bent by its own weight or being extended. In addition, the size of the gap varies depending on the position of the deposition surface of the substrate. For this reason, it is difficult to perform highly accurate patterning, and it is therefore difficult to achieve high definition due to the occurrence of positional offset between the mask and the substrate during vapor deposition and the occurrence of color mixing.

Also, when the mask is made large, the mask as well as a frame or the like for holding the mask need to be gigantic, which increases the weight and makes handling thereof difficult. As a result, there is a possibility that productivity and safety might be compromised. Also, the vapor deposition device and devices that are used together therewith need to be made gigantic and complex as well, which makes device designing difficult and increases the installation cost.

For the reasons described above, the conventional methods for vapor deposition by color are difficult to adapt to large-sized substrates, and no methods have been devised that can perform vapor deposition by color on large-sized substrates such as those having a size exceeding 60 inches on a mass manufacturing level.

Meanwhile, with the vapor deposition method, if there is a gap between the substrate and the mask, blur may occur at the edge of a formed coating film due to the vapor deposition material extending beyond the edge of the coating film.

In an organic EL display device, if blur occurs at the edge of a light emitting layer formed by vapor deposition by color, the vapor deposition material adheres to the neighboring light emitting layer having a different color, causing color mixing. In order to prevent color mixing from occurring, it is necessary to increase the non-light-emitting region by reducing the opening width of pixels or increasing the pixel pitch. However, reduction of the opening width of pixels reduces brightness. If the current density is increased in order to obtain the required brightness, the service life of the organic EL element may be shortened, or the organic EL element may be easily damaged, reducing reliability. On the other hand, if the pixel pitch is increased, display of high definition images cannot be achieved, and the display quality decreases.

Thus, it is desirable to prevent blur at the edge of the coating film.

Furthermore, with the vapor deposition method, the temperature of the units of the vapor deposition device increases and the dimension of each unit changes according to its thermal expansion coefficient. If the position of a coating film to be formed on the substrate offsets from a desired position due to such dimensional changes, the vapor deposition material adheres to the neighboring light emitting layer having a different color, causing color mixing.

It is an object of the present invention to provide a vapor deposition method and a vapor deposition device that can form a coating film in which edge blur is suppressed at a desired position of the substrate and that can be applied to large-sized substrates.

It is another object of the present invention to provide a large-sized organic EL display device that is excellent in terms of reliability and display quality.

Means for Solving Problem

A vapor deposition method according to the present invention is a vapor deposition method for forming a coating film having a predetermined pattern on a substrate, and the method includes a vapor deposition step of forming the coating film by causing vapor deposition particles to adhere onto the substrate. The vapor deposition step is a step in which with the use of a vapor deposition unit including a vapor deposition source having a plurality of vapor deposition source openings that discharge the vapor deposition particles, a vapor deposition mask disposed between the plurality of vapor deposition source openings and the substrate, and a control plate unit that includes a plurality of control plates disposed along a first direction orthogonal to a normal line direction of the substrate and that is disposed between the vapor deposition source and the vapor deposition mask, the vapor deposition particles that have passed through a space between the control plates adjacent in the first direction and a plurality of mask openings formed in the vapor deposition mask are caused to adhere onto the substrate while one of the substrate and the vapor deposition unit is moved relative to the other along a second direction orthogonal to the normal line direction of the substrate and the first direction in a state in which the substrate and the vapor deposition mask are spaced apart at a fixed interval. The vapor deposition method further includes a step of detecting a difference in an amount of thermal expansion in the first direction between the vapor deposition source and the control plate unit, and a step of correcting the difference in the amount of thermal expansion.

An organic EL display device according to the present invention includes a light emitting layer formed by using the above vapor deposition method of the present invention.

A vapor deposition device according to the present invention is a vapor deposition device that forms a coating film having a predetermined pattern on a substrate, and the device includes a vapor deposition unit including a vapor deposition source having a plurality of vapor deposition source openings that discharge vapor deposition particles for forming the coating film, a vapor deposition mask disposed between the plurality of vapor deposition source openings and the substrate, and a control plate unit that includes a plurality of control plates disposed along a first direction orthogonal to a normal line direction of the substrate and that is disposed between the vapor deposition source and the vapor deposition mask, a moving mechanism that moves one of the substrate and the vapor deposition unit relative to the other along a second direction orthogonal to the normal line direction of the substrate and the first direction in a state in which the substrate and the vapor deposition mask are spaced apart at a fixed interval, a means for detecting a difference in an amount of thermal expansion in the first direction between the vapor deposition source and the control plate unit, and a means for correcting the difference in the amount of thermal expansion.

Effects of the Invention

According to the vapor deposition method and vapor deposition device of the present invention, the vapor deposition particles that have passed through the mask openings formed in the vapor deposition mask are caused to adhere to the substrate while one of the substrate and the vapor deposition unit is moved relative to the other, and therefore a vapor deposition mask that is smaller than the substrate can be used. It is therefore possible to form a coating film even on a large-sized substrate by vapor deposition.

The plurality of control plates provided between the vapor deposition source opening and the vapor deposition mask selectively capture the vapor deposition particles that have entered a space between neighboring control plates in the first direction according to the incidence angle of the vapor deposition particles, and thus only the vapor deposition particles entering at a predetermined incidence angle or less enter the mask openings. As a result, the maximum incidence angle of the vapor deposition particles with respect to the substrate becomes small, and it is therefore possible to suppress blur that occurs at the edge of the coating film formed on the substrate.

Also, a difference in the amount of thermal expansion in the first direction between the vapor deposition source and the control plate unit is detected and corrected. It is thereby possible to suppress positional offsets in the first direction of the coating film to be formed on the substrate even if the amounts of thermal expansion of the vapor deposition source and the control plate unit are different each other, which occur due to temperature changes thereof.

The organic EL display device of the present invention includes a light emitting layer formed by using the vapor deposition method described above, and therefore the positional offset of the light emitting layer and edge blur in the light emitting layer are suppressed. Accordingly, it is possible to provide an organic EL display device that has excellent reliability and display quality and that can be made in a large size.

BRIEF DESCRIPTION OF DRAWINGS

FIG. 11 is a perspective view showing principal parts of a vapor deposition device according to Embodiment 1 of the present invention.

DESCRIPTION OF THE INVENTION

Figure 1:
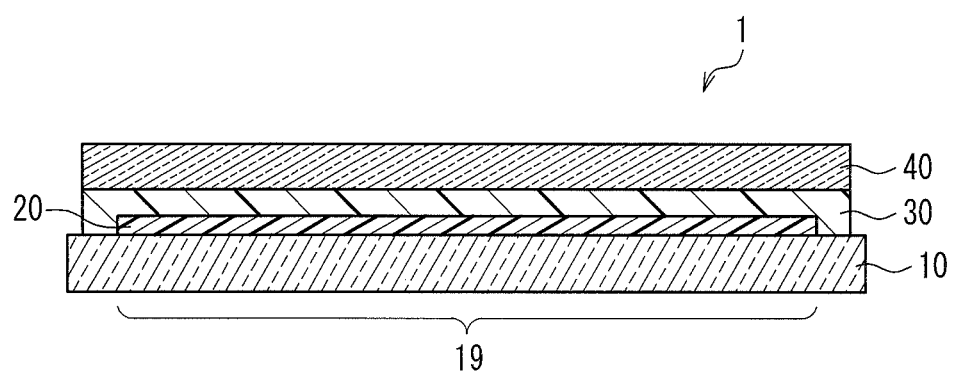
FIG. 1 is a cross-sectional view showing a schematic configuration of an organic EL display device.

A vapor deposition method according to the present invention is a vapor deposition method for forming a coating film having a predetermined pattern on a substrate, and the method includes a vapor deposition step of forming the coating film by causing vapor deposition particles to adhere onto the substrate. The vapor deposition step is a step in which with the use of a vapor deposition unit including a vapor deposition source having a plurality of vapor deposition source openings that discharge the vapor deposition particles, a vapor deposition mask disposed between the plurality of vapor deposition source openings and the substrate, and a control plate unit that includes a plurality of control plates disposed along a first direction orthogonal to a normal line direction of the substrate and that is disposed between the vapor deposition source and the vapor deposition mask, the vapor deposition particles that have passed through a space between the control plates adjacent in the first direction and a plurality of mask openings formed in the vapor deposition mask are caused to adhere onto the substrate while one of the substrate and the vapor deposition unit is moved relative to the other along a second direction orthogonal to the normal line direction of the substrate and the first direction in a state in which the substrate and the vapor deposition mask are spaced apart at a fixed interval. The vapor deposition method further includes a step of detecting a difference in an amount of thermal expansion in the first direction between the vapor deposition source and the control plate unit, and a step of correcting the difference in the amount of thermal expansion.

In the vapor deposition method of the present invention, it is preferable that the difference in the amount of thermal expansion is corrected by rotating the vapor deposition source within a plane parallel to the first direction and the second direction. Accordingly, with a simple method, it is possible to correct the positional offsets in the first direction of the vapor deposition source openings with respect to the control plates caused by the difference in thermal expansion between the vapor deposition source and the control plate unit.

In the above-described method, it is preferable that the vapor deposition source is rotated about a central axis of rotation that passes through a central position in the first direction of the vapor deposition source. Accordingly, it is possible to correct the positional offsets in the first direction of all of the vapor deposition source openings with respect to the control plates, with a small rotation angle.

It is preferable that the step of detecting the difference in the amount of thermal expansion and the step of correcting the difference in the amount of thermal expansion are performed before the coating film is formed on the substrate. Accordingly, it is possible to correct the positional offsets in the first direction of the vapor deposition source openings with respect to the control plates caused by the difference in the amount of thermal expansion between the vapor deposition source and the control plate unit, which occurred during the heating process from room temperature to the vapor deposition temperature.

The step of detecting the difference in the amount of thermal expansion and the step of correcting the difference in the amount of thermal expansion may be performed while the coating film is formed on the substrate. Accordingly, it is possible to correct the positional offsets in the first direction of the vapor deposition source openings with respect to the control plates caused by the difference in the amount of thermal expansion between the vapor deposition source and the control plate unit, which occurred due to a temperature change during vapor deposition.

The difference in the amount of thermal expansion may be detected by separately observing the vapor deposition source and the control plate unit from different locations that are other than the vapor deposition source and the control plate unit.

Alternatively, the difference in the amount of thermal expansion may be detected by simultaneously observing the vapor deposition source and the control plate unit from a common location that is other than the vapor deposition source and the control plate unit. Accordingly, it is possible to detect the difference in the amount of thermal expansion highly accurately. Also, it is possible to reduce the number of devices for detecting the difference in the amount of thermal expansion.

Alternatively, the difference in the amount of thermal expansion may be detected by observing one of the vapor deposition source and the control plate unit from the other. Accordingly, it is possible to simplify processing for computing the difference in the amount of thermal expansion. Also, it is possible to reduce the number of devices for detecting the difference in the amount of thermal expansion.

It is preferable that the above vapor deposition method of the present invention further includes a step of detecting an amount of positional offset in the first direction between the vapor deposition source and the control plate unit, and a step of correcting the amount of positional offset. Accordingly, it is possible to further reduce the amount of positional offset in the first direction of the vapor deposition source openings with respect to the control plates.

In the above-described method, it is preferable that the amount of positional offset is corrected by moving the vapor deposition source in the first direction. Accordingly, with a simple method, it is possible to correct positional offset in the first direction between the vapor deposition source and the control plate unit.

It is preferable that the amount of positional offset is corrected before the difference in the amount of thermal expansion is corrected. Accordingly, it is possible to correct the positional offsets in the first direction of all of the vapor deposition source openings with respect to the control plates, with a small rotation angle.

It is preferable that the step of detecting the amount of positional offset and the step of correcting the amount of positional offset are performed before the coating film is formed on the substrate. Accordingly, it is possible to correct the positional offsets in the first direction between the vapor deposition source and the control plate unit, which occurred during the heating process from room temperature to the vapor deposition temperature.

The step of detecting the amount of positional offset and the step of correcting the amount of positional offset may be performed while the coating film is formed on the substrate. Accordingly, it is possible to correct the positional offsets between the vapor deposition source and the control plate unit, which occurred due to a temperature change during vapor deposition.

The amount of positional offset may be detected by separately observing the vapor deposition source and the control plate unit from different locations that are other than the vapor deposition source and the control plate unit.

Alternatively, the amount of positional offset may be detected by simultaneously observing the vapor deposition source and the control plate unit from a common location that is other than the vapor deposition source and the control plate unit. Accordingly, it is possible to detect the amount of positional offset highly accurately. Also, it is possible to reduce the number of devices for detecting the amount of positional offset.

Alternatively, the amount of positional offset may be detected by observing one of the vapor deposition source and the control plate unit from the other. Accordingly, it is possible to simplify processing for computing the amount of positional offset. Also, it is possible to reduce the number of devices for detecting the amount of positional offset.

It is preferable that the coating film is a light emitting layer for an organic EL element. Accordingly, it is possible to provide an organic EL display device that has excellent reliability and display quality and that can be made in a large size.

A vapor deposition device according to the present invention is a vapor deposition device that forms a coating film having a predetermined pattern on a substrate, and the device includes a vapor deposition unit including a vapor deposition source having a plurality of vapor deposition source openings that discharge vapor deposition particles for forming the coating film, a vapor deposition mask disposed between the plurality of vapor deposition source openings and the substrate, and a control plate unit that includes a plurality of control plates disposed along a first direction orthogonal to a normal line direction of the substrate and that is disposed between the vapor deposition source and the vapor deposition mask, a moving mechanism that moves one of the substrate and the vapor deposition unit relative to the other along a second direction orthogonal to the normal line direction of the substrate and the first direction in a state in which the substrate and the vapor deposition mask are spaced apart at a fixed interval, a means for detecting a difference in an amount of thermal expansion in the first direction between the vapor deposition source and the control plate unit, and a means for correcting the difference in the amount of thermal expansion.

In the vapor deposition device of the present invention, it is preferable that the means for correcting the difference in the amount of thermal expansion includes a rotary drive mechanism that rotates the vapor deposition source within a plane parallel to the first direction and the second direction. Accordingly, with a simple method, it is possible to correct the positional offsets in the first direction of the vapor deposition source openings with respect to the control plates caused by the difference in thermal expansion between the vapor deposition source and the control plate unit.

It is preferable that the vapor deposition device of the present invention further includes a means for detecting an amount of positional offset in the first direction between the vapor deposition source and the control plate unit, and a means for correcting the amount of positional offset. Accordingly, it is possible to further reduce the amount of positional offset in the first direction of the vapor deposition source openings with respect to the control plate unit.

In the above-described device, it is preferable that the means for correcting the amount of positional offset includes a linear drive mechanism that moves the vapor deposition source in the first direction. Accordingly, with a simple method, it is possible to correct positional offset in the first direction between the vapor deposition source and the control plate unit.

It is preferable that the means for detecting the amount of positional offset includes a member that is common to the means for correcting the difference in the amount of thermal expansion. Accordingly, it is possible to reduce a component count, thereby simplifying the configuration of the vapor deposition device and reducing the cost.

Hereinafter, the present invention will be described in detail by showing preferred embodiments and examples. It should be noted, however, that the present invention is not limited to the following embodiments. For the sake of convenience of the description, the drawings referred to hereinafter show only the principal members required to describe the present invention in simplified form among the constituent members of the embodiments and the examples of the present invention. Accordingly, the present invention may include arbitrary constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
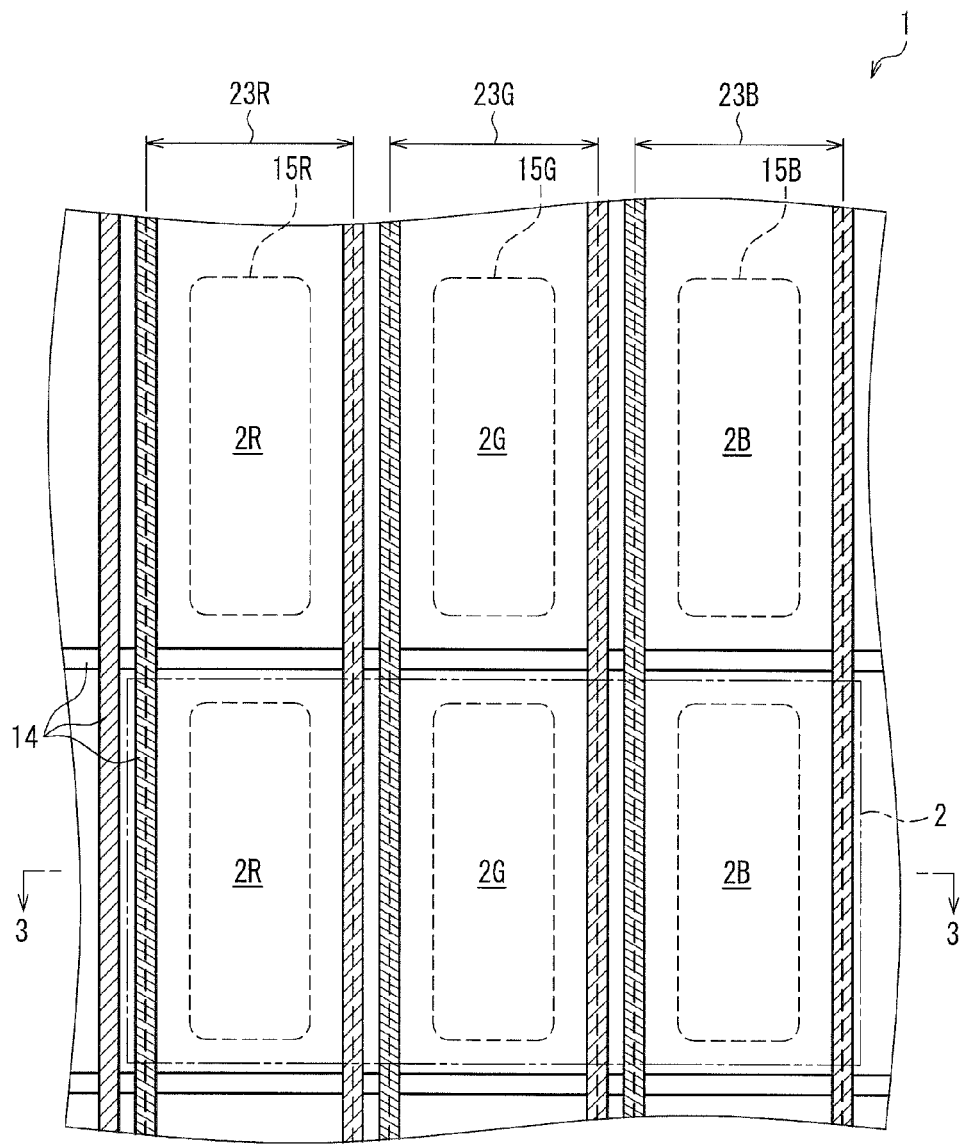
FIG. 2 is a plan view showing a configuration of pixels that constitute the organic EL display device shown in FIG. 1.
Figure 3:
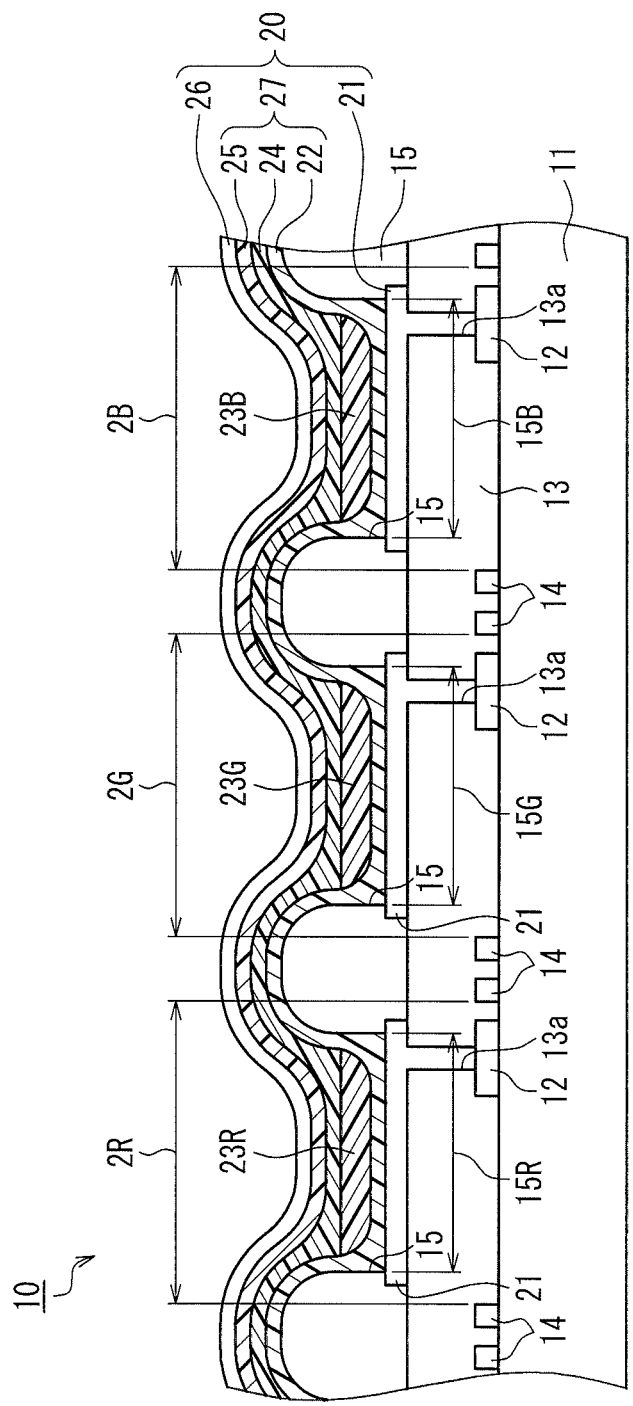
FIG. 3 is a cross-sectional view of a TFT substrate that constitutes the organic EL display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line III-III of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the perpendicular direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described. As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the organic EL layer 27. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the organic EL layer.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
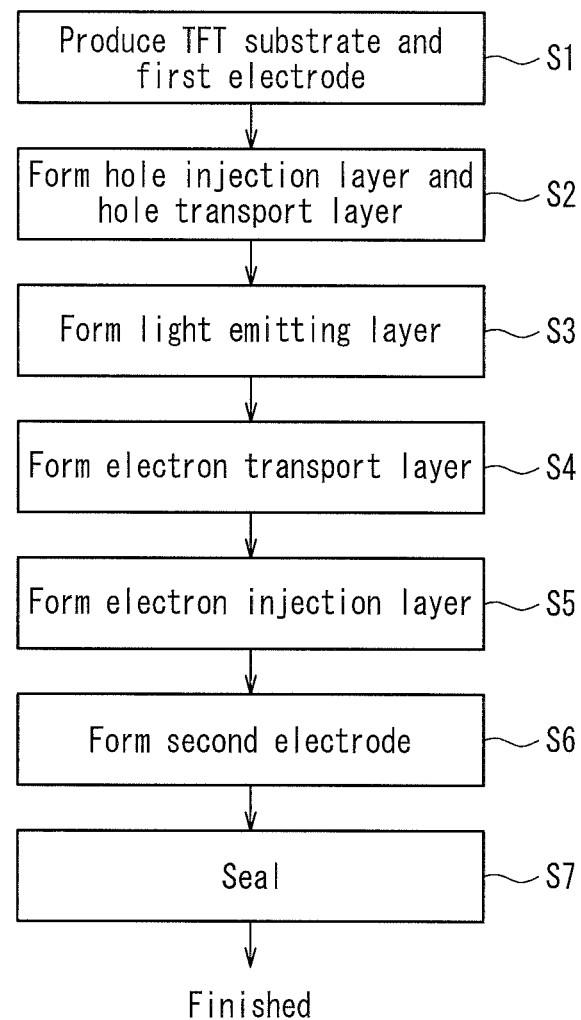
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the edge cover 15. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2). Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, heterocyclic or linear conjugated monomers, oligomers or polymers, such as polysilane-based compounds, vinylcarbazole-based compounds, thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinato) beryllium complex, tri(dibenzoylmethyl)phenanthroline europium complex, ditolyl vinyl biphenyl and the like.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LiF (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, S3, which is the step of forming light emitting layers 23R, 23G and 23B by vapor deposition by color, will be described.

(New Vapor Deposition Method)

The present inventors investigated, as the method for forming light emitting layers 23R, 23G and 23B by vapor deposition by color, a new vapor deposition method (hereinafter referred to as the "new vapor deposition method") in which vapor deposition is performed while a substrate is moved with respect to a vapor deposition source and a vapor deposition mask, instead of the vapor deposition method as disclosed in Patent Documents 1 and 2 in which a mask having the same size as a substrate is fixed to the substrate at the time of vapor deposition.

Figure 5:
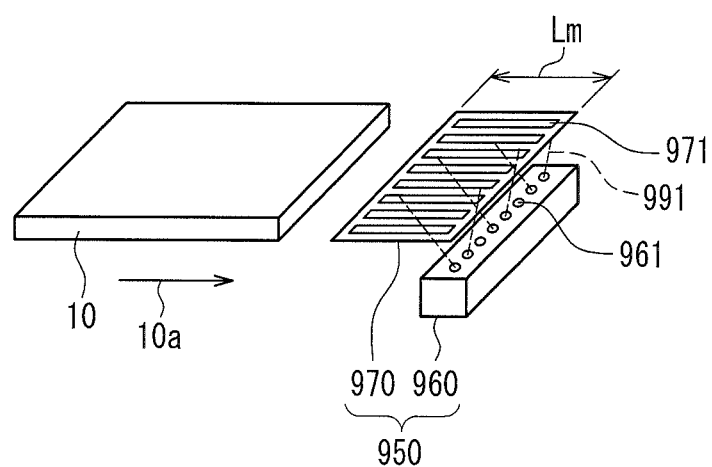
FIG. 5 is a perspective view showing the basic concept of a new vapor deposition method.

FIG. 5 is a perspective view showing the basic concept of the new vapor deposition method.

A vapor deposition source 960 and a vapor deposition mask 970 together constitute a vapor deposition unit 950. The relative position between the vapor deposition source 960 and the vapor deposition mask 970 is constant. A substrate 10 is moved at a constant speed in a direction indicated by 10a on the opposite side across the vapor deposition mask 970 from the vapor deposition source 960. A plurality of vapor deposition source openings 961 through which vapor deposition particles 991 are discharged are formed on the upper surface of the vapor deposition source 960. A plurality of mask openings 971 are formed in the vapor deposition mask 970. The vapor deposition particles 991 discharged from the vapor deposition source openings 961 pass through the mask openings 971 and adhere to the substrate 10. Vapor deposition is repeatedly performed for each color of light emitting layers 23R, 23G and 23B, whereby vapor deposition by color for forming light emitting layers 23R, 23G and 23B can be performed.

According to this new vapor deposition method, a dimension Lm of the vapor deposition mask 970 in the movement direction 10a of the substrate 10 can be set irrespective of a dimension of the substrate 10 in the same direction. This enables the use of a vapor deposition mask 970 that is smaller than the substrate 10. Accordingly, even if the substrate 10 is made large, the vapor deposition mask 970 does not need to be made large, and therefore the problem in that the vapor deposition mask 970 is bent by its own weight or being extended does not occur. Also, the vapor deposition mask 970 and a frame or the like for holding the vapor deposition mask 970 do not need to be made big and heavy. Accordingly, the problems encountered with the conventional vapor deposition methods disclosed in Patent Documents 1 and 2 are solved, and large-sized substrates can be subjected to vapor deposition by color.

However, the present inventors found, as a result of a further investigation, the new vapor deposition method shown in FIG. 5 is problematic in that a blur is more likely to occur at the edges of the formed coating film (vapor deposition film) as compared to the vapor deposition methods of Patent Documents 1 and 2. The cause of this problem will be described below.

Figure 6:
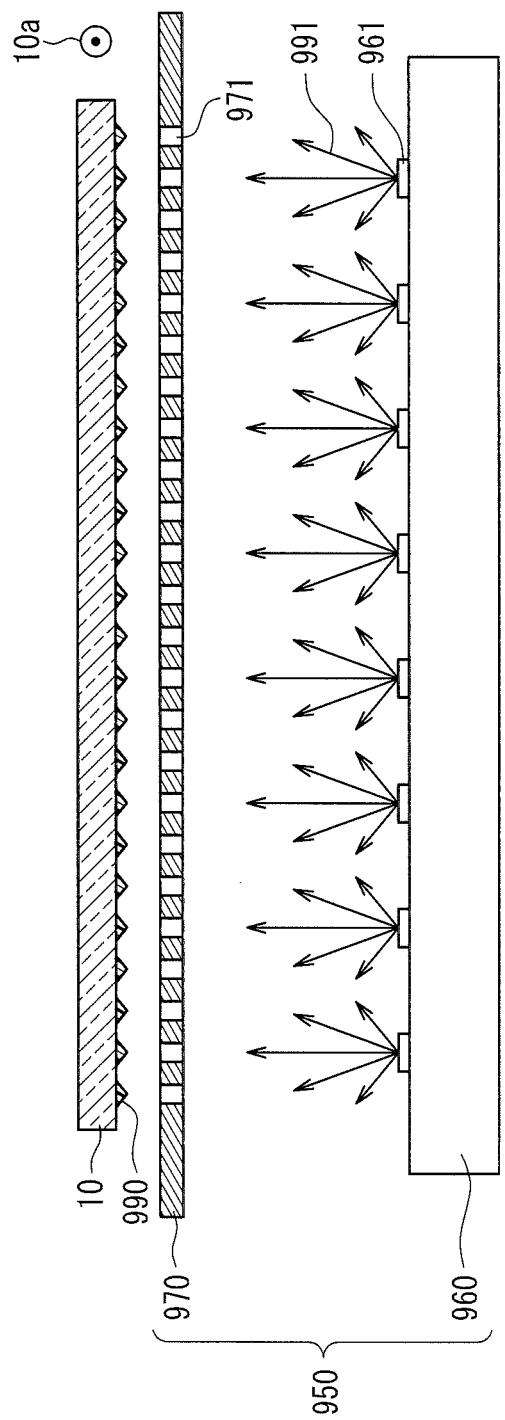
FIG. 6 is a front cross-sectional view of the vapor deposition device shown in FIG. 5 as viewed in a direction parallel to the movement direction of a substrate.

FIG. 6 is a cross-sectional view of the vapor deposition device shown in FIG. 5 as viewed in a plane perpendicular to the movement direction 10a of the substrate 10. A plurality of vapor deposition source openings 961 and a plurality of the mask opening 971 are arranged in the right-left direction of FIG. 6. The vapor deposition particles 991 from each vapor deposition source opening 961 are discharged over a certain range (directivity). Specifically, in FIG. 6, the number of vapor deposition particles 991 discharged from each vapor deposition source opening 961 is the greatest in a direction directly above the vapor deposition source opening 961 and gradually decreases as the angle (departure angle) formed with respect to the straight upward direction increases. The vapor deposition particles 991 discharged from the vapor deposition source openings 961 travel straight in their discharged direction. In FIG. 6, the flow of vapor deposition particles 991 discharged from the vapor deposition source openings 961 is conceptually indicated by arrows. Accordingly, each mask opening 971 mostly receives, but not necessarily limited thereto, the vapor deposition particles 991 discharged from the vapor deposition source opening 961 located directly below the mask opening 971 and also receives the vapor deposition particles 991 discharged from the vapor deposition source openings 961 located obliquely downward.

Figure 7:
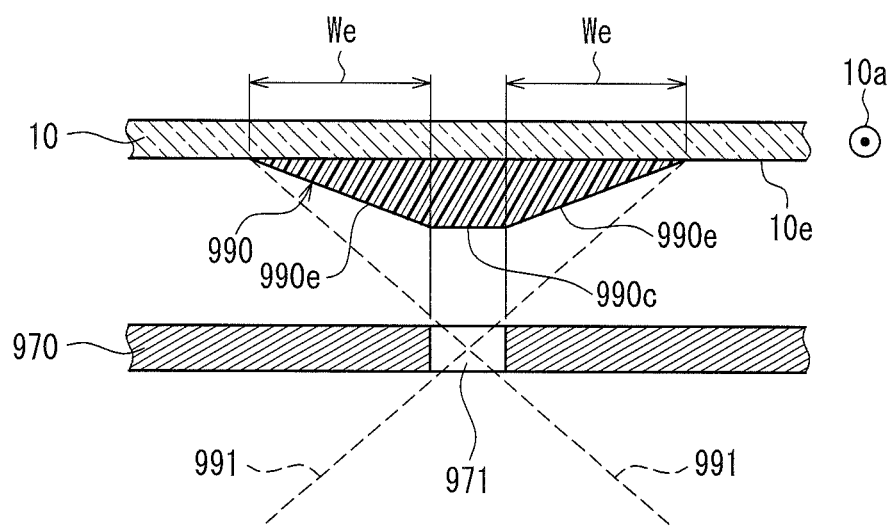
FIG. 7 is a cross-sectional view illustrating the cause of blur generated at the edges of a coating film in the new vapor deposition method shown in FIG. 5.

FIG. 7 is a cross-sectional view of a coating film 990 formed on a substrate 10 by vapor deposition particles 991 that have passed through a mask opening 971, as viewed in a plane perpendicular to the movement direction 10a of the substrate 10 as in FIG. 6. As described above, the vapor deposition particles 991 coming from various directions pass through the mask opening 971. The number of vapor deposition particles 991 that reach a deposition surface 10e of the substrate 10 is the greatest in a region directly above the mask opening 971 and gradually decreases as the position gets farther away therefrom. Accordingly, as shown in FIG. 7, on the deposition surface 10e of the substrate 10, a coating film main portion 990c having a sizable and substantially constant thickness is formed in the region where the mask opening 971 is projected onto the substrate 10 from directly above, and a blur portion 990e that is gradually thinner as the position gets farther away from the coating film main portion 990c is formed on both sides of the coating film main portion 990c.

In order to reduce the width We of the blur portion 990e, a space between the vapor deposition mask 970 and the substrate 10 needs only be reduced. However, with the new vapor deposition method, because it is necessary to move the substrate 10 relative to the vapor deposition mask 970, it is not possible to reduce the space between the vapor deposition mask 970 and the substrate 10 to zero.

If the blur portion 990e extends to the neighboring light emitting layer region having a different color due to an increase in the width We of the blur portion 990e, it causes "color mixing" or degradation of the characteristics of the organic EL element. In order to prevent the blur portion 990e from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

As described above, although the new vapor deposition method shown in FIG. 5 has a feature of being capable of performing vapor deposition by color for a large-sized substrate, the blur portion 990e easily occurs at the edge of the coating film (vapor deposition film) and also it is difficult to reduce the width We of the blur portion 990e.

(Second New Vapor Deposition Method)

As a method of vapor deposition by color that solves the above problems encountered with the new vapor deposition method shown in FIGS. 5 and 6, the present inventors investigated a vapor deposition method (hereinafter, referred to as the "second new vapor deposition method") in which a plurality of control plates are disposed between the vapor deposition source and the vapor deposition mask.

Figure 8:
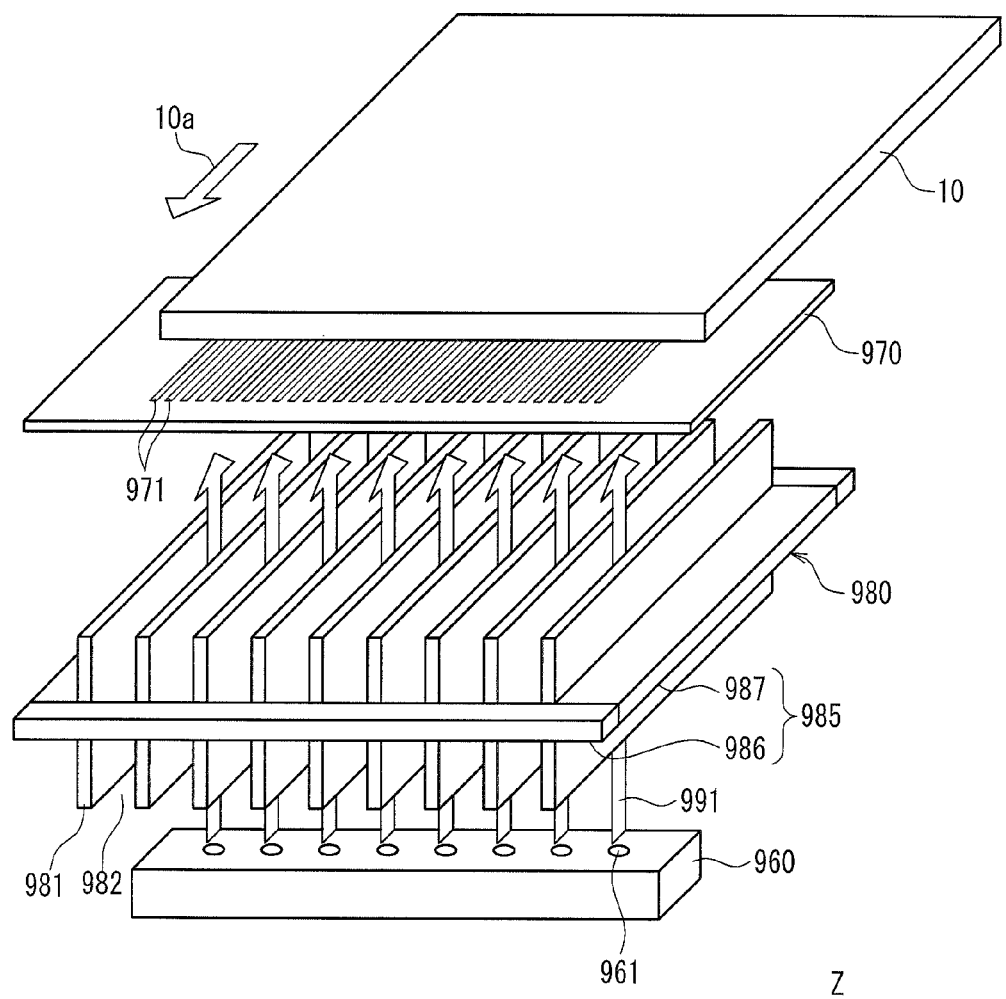
FIG. 8 is a perspective view showing the basic concept of a second new vapor deposition method.
Figure 9:
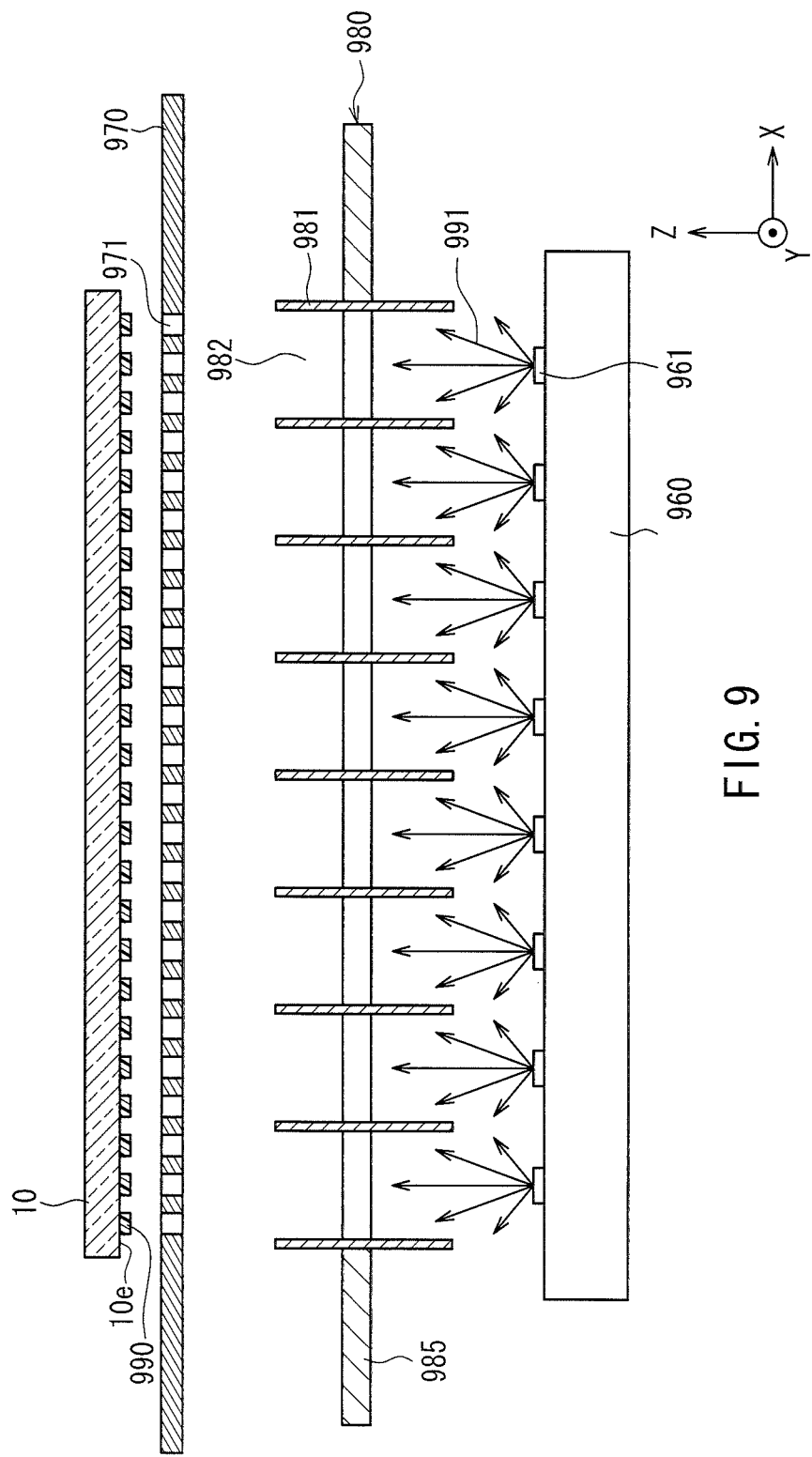
FIG. 9 is a front cross-sectional view of the vapor deposition device shown in FIG. 8 as viewed in a direction parallel to the traveling direction of a substrate.

FIG. 8 is a perspective view showing the basic concept of the second new vapor deposition method. FIG. 9 is a front cross-sectional view of the vapor deposition device shown in FIG. 8 as viewed in a direction parallel to the traveling direction of the substrate. In these diagrams, components that are the same as those shown in FIGS. 5 and 6 are given the same reference numerals, and thus a description thereof is not given here. For the sake of convenience of the description given below, an XYZ orthogonal coordinate system is set in which a horizontal axis extending along the width direction of the substrate 10 is defined as the X axis, a horizontal axis perpendicular to the X axis is defined as the Y axis, and an up-down direction axis perpendicular to the X axis and the Y axis is defined as the Z axis. The Y axis is parallel to the movement direction 10a of the substrate 10, and the Z axis is parallel to the normal line direction of the deposition surface 10e of the substrate 10.

A control plate unit 980 having a plurality of control plates 981 is disposed between the vapor deposition source 960 and the vapor deposition mask 970. The major surface (the surface having the largest area) of each control plate 981 is parallel to the YZ plane. The plurality of control plates 981 are disposed at a constant pitch in parallel to a direction in which a plurality of vapor deposition source openings 961 are arranged (specifically, the X axis direction).

The plurality of control plates 981 are integrally held by a frame-shaped holding body 985 by means of, for example, welding or the like, the holding body 985 including a pair of first holding members 986 parallel to the X axis direction and a pair of second holding members 987 parallel to the Y axis direction.

The action of the control plates 981 will be described.

The vapor deposition particles 991 discharged from each vapor deposition source opening 961 over a certain range (directivity) enter a space (hereinafter referred to as the "control space 982") between neighboring control plates 981. Among the vapor deposition particles 991, those having a large speed vector component in the X axis direction collide with and adhere to the control plates 981 and therefore cannot reach the mask openings 971. That is, the control plates 981 limit the incidence angle of the vapor deposition particles 991 entering the mask openings 971. As used herein, "incidence angle" of the vapor deposition particles 991 with respect to a mask opening 971 is defined as the angle formed between the flight direction of the vapor deposition particles 991 and the Z axis on a projection onto the XZ plane.

As described above, with the second new vapor deposition method, the directivity of the vapor deposition particles 991 in the X axis direction can be improved by using the plurality of control plates 981. Accordingly, the width We of the blur portion 990e can be reduced.

On the other hand, the plurality of control plates 981 are also parallel to the YZ plane, and therefore even vapor deposition particles 991 having a large speed vector component in the Y axis direction are not captured by the control plates 981. Accordingly, the reduction of the utilization efficiency of the vapor deposition material and the vapor deposition rate due to use of the plurality of control plates 981 is small.

With the second new vapor deposition method shown in FIGS. 8 and 9, in order to discharge the vapor deposition particles 991 from the vapor deposition source openings 961, it is necessary to maintain the vapor deposition source 960 at a predetermined high temperature during vapor deposition. Accordingly, the vapor deposition source 960 is thermally expanded during a heating process from a room temperature before the start of the vapor deposition to a high temperature.

Also, the control plate unit 980, the vapor deposition mask 970 and the like that are disposed in the vicinity of the vapor deposition source 960 also are heated by radiant heat or the like from the vapor deposition source 960 and are thermally expanded.

Accordingly, if there are thermal expansion rate differences and temperature differences (for example, difference in heating speed) between the vapor deposition source 960 and the peripheral members, a difference in the amount of thermal expansion occurs therebetween.

Figure 10A:
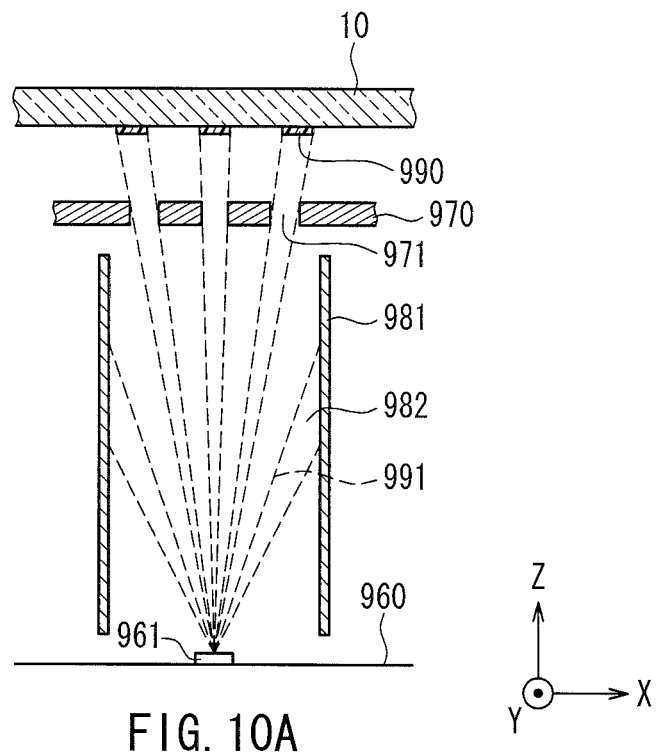
FIG. 10A is a cross-sectional view of a coating film formed on the substrate in an ideal state in the second new vapor deposition method.

FIG. 10A is a cross-sectional view of the coating film 990 formed on the substrate 10 in an ideal state in which a difference in the amount of thermal expansion does not occur between the vapor deposition source 960 and the peripheral members. In the present example, one vapor deposition opening 961 is disposed for one control space 982, and the vapor deposition opening 961 is disposed in a central position of the pair of control plates 981 in the X axis direction. The vapor deposition particles 991 that passes through the control space 982 and the mask opening 971 in this order among the vapor deposition particles 991 discharged from the vapor deposition opening 961 adhere to the substrate 10 to form the coating film 990.

Figure 10B:
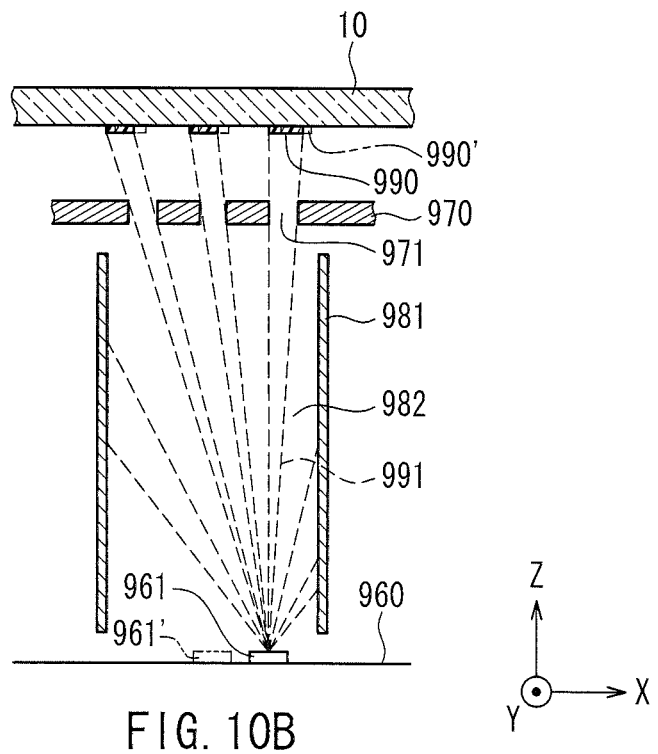
FIG. 10B is a cross-sectional view of a coating film formed on the substrate in a state in which a difference in the amount of thermal expansion between the vapor deposition source and the control plate unit occurs in the second new vapor deposition method.

FIG. 10B is a cross-sectional view of the coating film 990 formed on the substrate 10 in a state in which a difference in the amount of thermal expansion occurs between the vapor deposition source 960 and the control plate unit 980 and the vapor deposition mask 970. In the present example, the vapor deposition source 960 is thermally expanded, whereas the control plate unit 980 and the vapor deposition mask 970 are not substantially thermally expanded. As a result, the vapor deposition source opening 961 is positionally offset in the right direction with respect to the control plate 981 and the vapor deposition mask 970. The reference numeral 961' indicates a position of the vapor deposition source opening 961 in the ideal state shown in FIG. 10A. The position of the coating film 990 formed on the substrate 10 is positionally offset in the left direction with respect to the position 990' in the ideal state shown in FIG. 10A due to the vapor deposition source opening 961 being positionally offset relative to the control plate 981 and the vapor deposition mask 970.

With the second new vapor deposition method, as shown in FIG. 10B, the reason why the coating film 990 is positionally offset due to the relative positional offset of the vapor deposition source opening 61 is that the vapor deposition source opening 961 that discharges the vapor deposition particles 991 incident on each mask opening 971 is selected by the control plate 981.

In order to reduce the amount of positional offset of the coating film 990 shown in FIG. 10B, the space between the vapor deposition mask 970 and the substrate 10 needs only be reduced. However, with the second new vapor deposition method, because it is necessary to move the substrate 10 relative to the vapor deposition mask 970, the space between the vapor deposition mask 970 and the substrate 10 cannot be reduced to zero.

If the amount of positional offset of the coating film is large, the vapor deposition material adheres to the neighboring light emitting layer having a different color, causing color mixing. In order to prevent color mixing from occurring, it is necessary to increase the non-light emitting region by reducing the opening width of pixels (meaning sub-pixels 2R, 2G, and 2B) or increasing the pixel pitch. However, reduction of the opening width of pixels reduces brightness because the light emitting region is reduced. If the current density is increased in order to obtain the required brightness, the service life of the organic EL element may be shortened, or the organic EL element may be easily damaged, reducing reliability. On the other hand, if the pixel pitch is increased, display of high definition images cannot be achieved, and the display quality decreases.

The present inventors conducted an in-depth investigation to solve the above problems encountered with the second new vapor deposition method and the present invention has been accomplished. Hereinafter, preferred embodiments of the present invention will be described.

Embodiment 1

FIG. 11 is a perspective view showing principal parts of a vapor deposition device according to Embodiment 1 of the present invention. For the sake of convenience of the description given below, an XYZ orthogonal coordinate system is set in which a horizontal axis extending along the width direction (first direction) of the substrate 10 is defined as the X axis, a horizontal axis perpendicular to the X axis is defined as the Y axis, and an up-down direction axis perpendicular to the X axis and the Y axis is defined as the Z axis. The Z axis is parallel to the normal line direction of the deposition surface of the substrate 10. To facilitate the description, the side to which the arrow indicating the Z axis points (the upper side of FIG. 11) is referred to the "upper side".

A vapor deposition mask 70 is disposed so as to oppose a vapor deposition source 60 in the Z axis direction.

The vapor deposition source 60 has a plurality of vapor deposition source openings 61 in its upper surface (the surface facing the vapor deposition mask 70). The plurality of vapor deposition source openings 61 are arranged at a fixed pitch along a straight line substantially parallel to the X axis direction. Each vapor deposition source opening 61 has a nozzle shape that is upwardly open parallel to the Z axis and discharges vapor deposition particles 91, which are a light emitting layer-forming material, toward the vapor deposition mask 70.

The vapor deposition mask 70 is a plate-shaped piece that has a major surface (the surface having the largest area) parallel to the XY plane and in which a plurality of mask openings 71 are formed along the X axis direction at different positions in the X axis direction. In the present embodiment, each mask opening 71 has an opening shape having a slot shape that is parallel to the Y axis, but the present invention is not limited thereto. All of the mask openings 71 may have the same shape and dimensions, or may have different shapes and dimensions. The pitch in the X axis direction of the mask openings 71 may be constant or different.

The control plate unit 80 is disposed between the vapor deposition source openings 61 and the vapor deposition mask 70. The control plate unit 80 includes a plurality of control plates 81 arranged at a constant pitch along the X axis direction. The plurality of control plates 81 are thin plates having the same dimension, and the major surface (the surface having the largest area) are parallel to the Y axis and the Z axis. The space between the control plates 81 neighboring in the X axis direction is a control space 82 through which the vapor deposition particles 91 pass.

In FIG. 11, although the number of vapor deposition source openings 61 and the number of control spaces 82 are four, the present invention is not limited to this and the number may be larger or smaller than this. Also, the number of vapor deposition source openings 61 and the number of control spaces 82 are not necessarily the same, and either one may be larger than the other.

In the present embodiment, the control plate unit 80 is formed into a substantially rectangular parallelepiped object by forming rectangular parallelepiped through holes penetrating in the Z axis direction at a constant pitch in the X axis direction. Each through hole serves as the control space 82, and each wall between neighboring through holes serves as the control plate 81. However, the method for manufacturing the control unit 80 is not limited thereto. For example, similarly to the control unit 980 in FIG. 8, the plurality of control plates 81 having the same dimension that were made separately may be fixed to a substantially rectangular frame-shaped holding body at a constant pitch by means of welding or the like.

A shutter 95 made of a thin plate is disposed between the vapor deposition source 60 and the control plate unit 80, with the major surface thereof being parallel to the XY plane. The shutter 95 is capable of reciprocally moving between the position between the vapor deposition source 60 and the control plate unit 80 and the position to which this position is retracted. A state in which the shutter 95 is positioned between the vapor deposition source 60 and the control plate unit 80 is referred to as a shutter 95 close state, and in this state, the vapor deposition particles 91 discharged from the vapor deposition openings 61 are unable to enter the control space 82. A state in which the shutter 92 is retracted between the vapor deposition source 60 and the control plate unit 80 is referred to as a shutter 95 open state, and in this state, the vapor deposition particles 91 discharged from the vapor deposition openings 61 enter the control space 82.

The vapor deposition source openings 61 and the plurality of control plates 81 are spaced apart from each other in the Z axis direction, and the plurality of control plates 81 and the vapor deposition mask 70 are spaced apart from each other in the Z axis direction. The relative position of the vapor deposition source 60, the control plate unit 80, and the vapor deposition mask 70 are constant at least during vapor deposition by color, except for during position adjustment of the vapor deposition source 60 for performing correction (described later). The vapor deposition source 60, the shutter 95, the control plate unit 80, and the vapor deposition mask 70 together constitute a vapor deposition unit 50.

The substrate 10 is scanned (moved) in the Y axis direction (second direction) 10a at a constant speed by a moving mechanism (not shown) on the opposite side across the vapor deposition mask 70 from the vapor deposition source 60, with the substrate 10 being spaced apart from the vapor deposition mask 70 at a fixed interval.

When the shutter 92 is opened in a state in which the vapor deposition particles 91 are discharged from the vapor deposition source openings 61, the vapor deposition particles 91 pass through a control space 82 of the control plate unit 80, and a mask opening 71 of the vapor deposition mask 70 in this order. The deposition particles 91 adhere to the vapor deposition surface (specifically, the surface of the substrate 10 facing the vapor deposition mask 70) 10e of the substrate 10 traveling in the Y axis direction to form a coating film 90 (refer to FIG. 12 described later). The coating film 90 has a stripe shape extending in the Y axis direction.

The vapor deposition particles 91 that form the coating film 90 necessarily pass through the control space 82 and the mask opening 71. The control plate unit 80 and the vapor deposition mask 70 are designed so as to prevent a situation in which the vapor deposition particles 91 discharged from a vapor deposition source opening 61 reach the deposition surface 10e of the substrate 10 without passing through the control spaces 82 and the mask openings 71, and if necessary, a shielding plate (not shown) or the like that prevents flight of the vapor deposition particles 91 may be installed.

By performing vapor deposition three times by changing the vapor deposition material 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

As with the control plates 981 of the second new vapor deposition method shown in FIGS. 8 and 9, the control plates 81 limit the incidence angle of the vapor deposition particles 91 entering the mask openings 71 on a projection onto the XZ plane by causing the vapor deposition particles 91 having a large speed vector component in the X axis direction to collide with and adhere to the control plates 80a and 80b. As used herein, "incidence angle" of the vapor deposition particles 91 with respect to a mask opening 71 is defined as the angle formed between the flight direction of the vapor deposition particles 91 and the Z axis on a projection onto the XZ plane. As a result, the vapor deposition particles 91 that pass through a mask opening 71 at a large incidence angle are reduced. Accordingly, the width We of the blur portion 990e shown in FIG. 7 is reduced, and preferably the occurrence of blur portions 990e will substantially be prevented, and thus the occurrence of blur at both edges of the stripe-shaped coating film 90 can be suppressed significantly. As a result, in the organic EL display device, the need to increase the width of the non-light-emitting region between light-emitting regions so as to not cause color mixing is eliminated. Accordingly, it is possible to achieve display of high definition and high brightness images. In addition, the need to increase the current density in the light emitting layers in order to enhance brightness is also eliminated, a long service life can be achieved and reliability can be improved.

Figure 12:
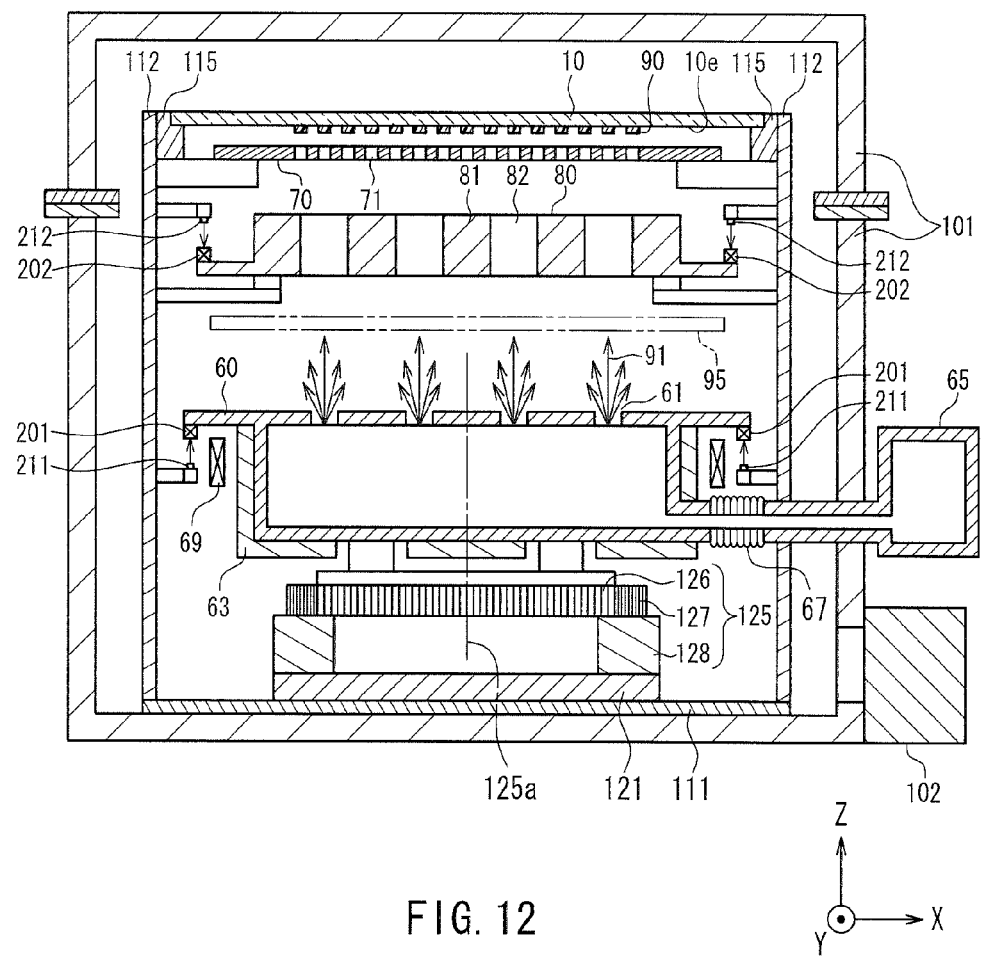
FIG. 12 is a front cross-sectional view of the vapor deposition device according to Embodiment 1 of the present invention as viewed in the scanning direction of a substrate.

FIG. 12 is a front cross-sectional view of the vapor deposition device according to Embodiment 1 as viewed in a direction perpendicular to the width direction of a substrate 10. The detailed configuration of the vapor deposition device according to Embodiment 1 will be described using FIG. 12.

A vapor deposition source 60 is installed on a frame bottom plate 111 via a linear drive mechanism 121 and a rotary drive mechanism 125.

The linear drive mechanism 121 moves the rotary drive mechanism 125 and the vapor deposition source 60, which are mounted on the linear drive mechanism 121, in the X axis direction so as to adjust the positions in the X axis direction of the rotary drive mechanism 125 and the vapor deposition source 60. There is no particular limitation on the configuration of the linear drive mechanism 121, and for example, a known uniaxial positioning device such as a linear motor can be used.

The rotary drive mechanism 125 rotates the vapor deposition source 60, which is mounted on the rotary drive mechanism 125, within a plane parallel to the XY plane so as to adjust the rotational position of the vapor deposition source 60 in that plane. A central axis 125a of rotation of the rotary drive mechanism 125 is parallel to the Z axis, and preferably passes through a central position between the vapor deposition source openings 61 located at opposite ends in the X axis direction of a plurality of vapor deposition source openings 61 formed in the vapor deposition source 60 (the central position will be referred to as "the central position in the X axis direction of the vapor deposition source 60"). In this example, the rotary drive mechanism 125 includes a large gear wheel 126 capable of rotation about the central axis 125a of rotation, a small gear wheel 127 that engages with the large gear wheel 126, and a stepping motor 128 that rotates the small gear wheel 127. The vapor deposition source 60 is mounted on the large gear wheel 126. However, the configuration of the rotary drive mechanism 125 is not limited thereto, and a known rotary positioning device can be used.

In order to heat the vapor deposition source 60 to a predetermined temperature and maintain the temperature, and at the same time to prevent vapor deposition particles 91 from adhering to the vapor deposition source 60, a heater 63 is attached around the vapor deposition source 60. The temperature of the vapor deposition source 60 during vapor deposition is set as appropriate according to the type of vapor deposition particles 91, and can be set to, for example, approximately 400° C.

A vapor deposition particle generation device 65 is disposed outside a chamber 101. The vapor deposition particle generation device 65 heats and vaporizes a vapor deposition material, and sends the steam generated from the vapor deposition material to the vapor deposition source 60 provided in the chamber 101 through a pipe. The pipe is provided with a flexible joint 67 for permitting a change in the position of the vapor deposition source 60. The steam from the vapor deposition material is discharged from the vapor deposition source openings 61 of the vapor deposition source 60, as vapor deposition particles 91. The vapor deposition particle generation device 65 may have a function of heating and vaporizing two or more vapor deposition materials separately, mixing the steams generated from the vapor deposition materials and sending the mixed steam to the vapor deposition source 60.

A shutter 95 is held by frame side plates 112 via a linear drive mechanism (not shown) that is capable of reciprocally moving the shutter 95 in the Y axis direction.

A control plate unit 80 is held by arms extending from the frame side plates 112.

A first alignment mark 201 is formed on each end in the X axis direction of the vapor deposition source 60. A first recognition unit 211 for recognizing the position of the first alignment mark 201 is disposed so as to oppose the alignment mark 201 in the Z axis direction. Likewise, a second alignment mark 202 is formed on each end in the X axis direction of the control plate unit 80. A second recognition unit 212 for recognizing the position of the second alignment mark 202 is disposed so as to oppose the alignment mark 202. The first and second recognition units 211 and 212 are held by arms extending from the frame side plates 112, and the XY coordinate positions thereof are constant. There is no particular limitation on the configuration of the first and second recognition units 211 and 212 as long as it is possible to recognize the corresponding first and second alignment marks 201 and 202. For example, known CCD cameras can be used. In this case, the first and second alignment marks 201 and 202 can be in any form or shape that can be recognized through image recognition using a CCD camera, or a combination thereof.

In order to prevent the first recognition units 211 disposed near the vapor deposition source 60 from being heated by the vapor deposition source 60 and the heater 63, a heat shielding plate 69 is disposed between each first recognition unit 211 and the vapor deposition source 60 and the heater 63. There is no particular limitation on the configuration of the heat shielding plates 69, and for example, the heat shielding plates 69 can be cooling plates internally provided with a water cooling pipe or the like.

It is preferable that the first and second alignment marks 201 and 202, and the first and second recognition units 211 and 212 are disposed at positions that cannot be seen directly from the vapor deposition source openings 61, in order to make it difficult for the vapor deposition particles 91 discharged from the vapor deposition source openings 61 to adhere thereto. Where necessary, it may be possible to provide protection plates (or shielding plates) for preventing the vapor deposition particles 91 from adhering to the first and second alignment marks 201 and 202, and the first and second recognition units 211 and 212.

In contrast to this example, it is also possible to provide the first recognition units 211 on the opposite ends in the X axis direction of the vapor deposition source 60 and provide the first alignment marks 201 on the arms extending from the frame side plate 112. Likewise, it is also possible to provide the second recognition units 212 on the opposite ends in the X axis direction of the control plate unit 80 and provide the second alignment marks 202 on the arms extending from the frame side plate 112. In this case, in order to particularly prevent the first recognition units 211 from being exposed to high temperatures, it is preferable to, where necessary, dispose a heat shielding plate (for example, a cooling plate internally provided with a water cooling pipe or the like) or the like between each first recognition unit 211 and the vapor deposition source 60.

A vapor deposition mask 70 is held on arms extending from the frame side plates 112. It is preferable that the vapor deposition mask 70 is accurately positioned particularly in the X axis direction with respect to the control plate unit 80. In order to prevent the occurrence of a slack and stretch of the vapor deposition mask 70 due to its own weight, it is preferable that the vapor deposition mask 70 is held via a tension mechanism (not shown) that applies tension to the vapor deposition mask 70 in a direction parallel to the major surface of the vapor deposition mask 70.

A substrate 10 is transferred in the Y axis direction by a linear transfer mechanism 115 provided to the frame side plates 112. There is no particular limitation on the configuration of the linear transfer mechanism 115, and for example, a transfer mechanism that drives rollers, on which the substrate 10 is placed, by using a stepping motor via a reduction gear mechanism can be used. In order to reduce a slack of the substrate 10 due to its own weight, it is also possible to attach a holding device onto the surface of the substrate 10 that is opposite to the deposition surface 10e and transfer the holding device by using the linear transfer mechanism 115. As the holding device, for example, an electrostatic chuck that holds the substrate 10 with electrostatic force can be used.

It is desirable that the relative position in the X axis direction of the substrate 10 with respect to the vapor deposition mask 70 during vapor deposition is accurate. For this reason, it may be possible to form alignment marks that are the same as the first and second alignment marks 201 and 202 on the vapor deposition mask 70 and the substrate 10, and control the relative position in the X axis direction between the substrate 10 and the vapor deposition mask 70 through image recognition with a CCD camera (not shown) or the like.

The various devices described above are housed in the vacuum chamber 101. The vacuum chamber 101 is a hermetically sealed container, with the pressure of its internal space being reduced and kept in a predetermined low pressure state (or vacuum state) by a vacuum pump 102.

In the vapor deposition device according to Embodiment 1, a difference in the amount of thermal expansion in the X axis direction between the vapor deposition source 60 and the control plate unit 80 is detected by using the first and second alignment marks 201 and 202 and the first and second recognition units 211 and 212, and then the difference in the amount of thermal expansion is corrected by using the rotary drive mechanism 125. This will be described below.

If there are variations in the temperature of the vapor deposition source 60, the amount of vapor deposition particles 91 discharged from the plurality of vapor deposition source openings 61 varies. Accordingly, in order to reduce the temperature variations, as a material for the vapor deposition source 60, a substrate made of copper, which generally has excellent thermal conductivity, with its surface being coated with nickel or the like is used. Copper has a thermal expansion coefficient of $16.8 \times 10^{-6}$° C. The temperature of the vapor deposition source 60 during vapor deposition is generally about 400° C. Accordingly, if, for example, the dimension in the X axis direction of the vapor deposition source 60 is 1 m, the dimension in the X axis direction of the vapor deposition source 60 will increase by 6.4 mm during the process of heating the vapor deposition source 60 from room temperature (20° C.) to 400° C. in order to perform vapor deposition.

Meanwhile, if the shape of the control plate unit 80 changes, thickness variations or positional offsets will occur in the coating film 90 having the shape of a plurality of stripes. Accordingly, in order to reduce the shape change due to a temperature change, for the control plate unit 80, an invar material generally having a small thermal expansion coefficient is used. The invar material has a thermal expansion coefficient of 1 to $2 \times 10^{-6}$° C. During vapor deposition, the control plate unit 80 may be heated to, for example, approximately to 220° C. by being heated by radiant heat or the like from the vapor deposition source 60. Accordingly, if, for example, the dimension in the X axis direction of the control plate unit 80 is 1 m, the dimension in the X axis direction of the control plate unit 80 will increase by 0.4 mm during the process of heating the control plate unit 80 from room temperature (20° C.) to 220° C. when vapor deposition is performed.

Accordingly, with respect to the amount of thermal expansion in the X axis direction before (room temperature) and at the time of vapor deposition, the vapor deposition source 60 becomes larger than the control plate unit 80 by about 6 mm. If such a difference in the amount of thermal expansion occurs between the vapor deposition source 60 and the control plate unit 80 as described above, the relative position of the vapor deposition source openings 61 with respect to the control plates 81 changes. As a result, as explained with reference to FIG. 10B, the coating film 90 is positionally offset in the X axis direction.

In the present embodiment, the amount of thermal expansion in the X axis direction of the vapor deposition source 60 is measured by using the first alignment marks 201 and the first recognition units 211. The amount of thermal expansion in the X axis direction of the control plate unit 80 is measured by using the second alignment marks 202 and the second recognition units 212 (the details of which will be described later.). Then, a difference in the amount of thermal expansion in the X axis direction between the vapor deposition source 60 and the control plate unit 80 is determined from the amounts of thermal expansion that have been measured.

Next, the rotary drive mechanism 125 is driven to rotate the vapor deposition source 60 about the central axis 125a of rotation so as to correct the determined difference in the amount of thermal expansion. For example, in order to correct (reduce) the dimension in the X axis direction of the vapor deposition source 60, which was elongated to 1.0064 m during vapor deposition, by 0.6 mm so as to match 1.0004 m, which is the dimension in the X axis direction of the control plate unit 80, it is sufficient that the vapor deposition source 60 is rotated by an angle $\theta=6.3°$ ($\theta=\cos^{-1}(1.0004/1.0064)$). It is thereby possible to reduce the amounts of positional offset in the X axis direction of the vapor deposition source openings 61 with respect to the control plates 81, caused by the difference in the amount of thermal expansion between the vapor deposition source 60 and the control plate unit 80. As a result, the amount of positional offset in the X axis direction of the coating film 90 formed on the substrate 10 can be reduced.

It is preferable to reduce the amounts of positional offset of all of the plurality of vapor deposition source openings 61 with respect to the control plates 81 to zero by rotating the vapor deposition source 60, but this may practically be difficult to achieve. Generally, if the amounts of positional offset in the X axis direction of all of the vapor deposition source openings 61 with respect to the control plates 81 can be reduced to 0.1 mm or less, the amount of positional offset in the X axis direction of the coating film 90 will be within a range that does not substantially cause any problem.

By the vapor deposition source 60 being rotated about the central axis 125a of rotation, the position in the Y axis direction of each vapor deposition source opening is changed. In the present embodiment, the required positional accuracy in the Y axis direction of the vapor deposition source opening 61 is much lower than that in the X axis direction, and therefore the changes in the positions in the Y axis direction of the vapor deposition source openings 61 as a result of the vapor deposition source 60 being rotated substantially pose no problem.

The direction of rotation of the vapor deposition source 60 may be either clockwise or counterclockwise as viewed from above.

During the process in which the vapor deposition source 60 and the control plate unit 80 are thermally expanded, a situation may occur in which the relative positional relationship in the X axis direction between the vapor deposition source 60 and the control plate unit 80 changes. For example, the central position in the X axis direction of the vapor deposition source 60 and the central position in the X axis direction of the control plate unit 80 that matched at room temperature before vapor deposition may not become matched when the temperature is increased to the vapor deposition temperature. The relative positions of the vapor deposition source openings 61 with respect to the control plates 81 are changed also due to such a positional offset in the X axis direction between the vapor deposition source 60 and the control plate unit 80. In the present embodiment, such a positional offset can be corrected by using the linear drive mechanism 121. For example, the linear drive mechanism 121 may be driven to adjust the positions in the X axis direction of the rotary drive mechanism 125 and the vapor deposition source 60 such that the central position in the X axis direction of the vapor deposition source 60 matches the central position in the X axis direction of the control plate unit 80 (preferably matches the central axis 125a of rotation). The adjustment of the position in the X axis direction by the linear drive mechanism 121 is preferably performed before the vapor deposition source 60 is rotated by the rotary drive mechanism 125. Through this, the amounts of positional offset in the X axis direction of all of the vapor deposition source openings 61 with respect to the control plates 81 can be easily corrected with a small rotation angle θ.

Figure 13:
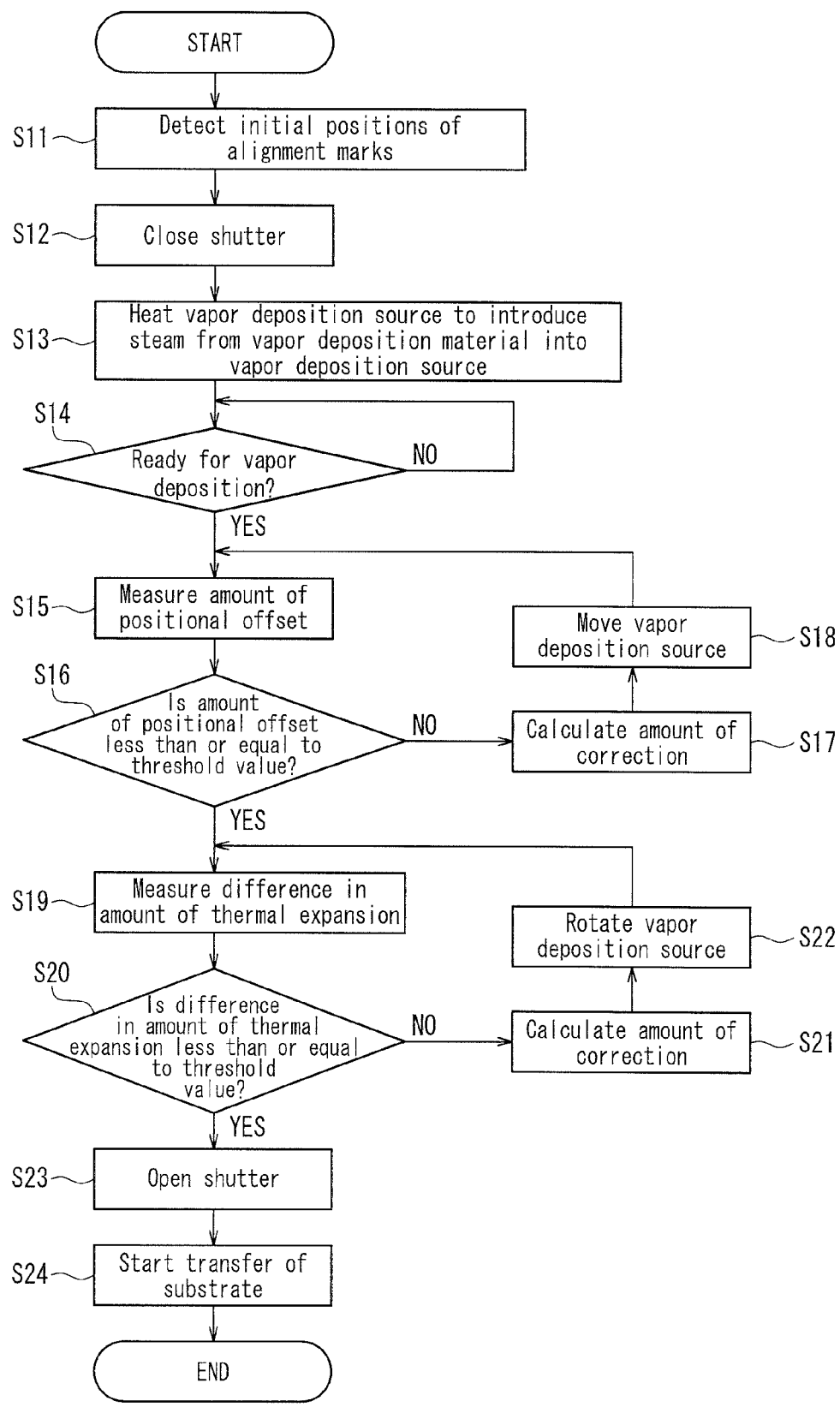
FIG. 13 is a flowchart of the vapor deposition method using the vapor deposition device according to Embodiment 1 of the present invention.

FIG. 13 is a flowchart of a vapor deposition method using the vapor deposition device according to Embodiment 1. The vapor deposition method according to Embodiment 1 will be described with reference to FIG. 13.

First, the initial position of each alignment mark is detected at room temperature (step S11). Specifically, the first alignment marks 201 are recognized by the first recognition units 211, and the second alignment marks 202 are recognized by the second recognition units 212. Then, the absolute positions of the recognized first and second alignment marks 201 and 202 in the XY coordinate are detected. Where necessary, the vapor deposition source 60 may be rotated by the rotary drive mechanism 125 such that the arrangement direction (or in other words, X axis direction) of the plurality of vapor deposition source openings 61 of the vapor deposition source 60 matches the arrangement direction of the plurality of control plates 81 of the control plate unit 80. Also, the vapor deposition source 60 may be moved in the X axis direction by using the linear drive mechanism 121 such that the central axis 125a of rotation matches the central position in the X axis direction of the control plate unit 80. It is preferable that the vapor deposition source 60 is installed on the rotary drive mechanism 125 such that the central position in the X axis direction of the vapor deposition source 60 passes through the central axis 125a of rotation.

Next, the shutter 95 is closed (step S12). It should be noted that the order of step S11 and step S12 may be reversed.

Next, the vapor deposition source 60 is heated by the heater 63. In parallel to this, a vapor deposition material is heated and vaporized in the vapor deposition particle generation device 65 so as to introduce steam from the vapor deposition material into the vapor deposition source 60 (step S13). This starts the discharge of vapor deposition particles 91 from the vapor deposition source openings 61.

The temperature of the vapor deposition source 60, the amount of vapor deposition particles 91 discharged from the vapor deposition source openings 61, and the like are monitored, and it is determined whether or not the vapor deposition device has reached a vapor deposition ready state (step S14).

If it is determined that the vapor deposition device has reached a vapor deposition ready state, the amount of positional offset in the X axis direction of the vapor deposition source 60 with respect to the control plate unit 80 is measured (step S15). Specifically, the positions of the first alignment marks 201 are detected by the first recognition units 211 and then compared with the positions detected in step S11, and thereby the amount of shift of the central position in the X axis direction of the vapor deposition source 60 is determined. Likewise, the positions of the second alignment marks 202 are detected by the second recognition units 212 and then compared with the positions detected in step S11, and thereby the amount of shift of the central position in the X axis direction of the control plate unit 80 is determined. Then, from the amount of shift of the central position of the vapor deposition source 60 and the amount of shift of the central position of the control plate unit 80, the amount of positional offset in the X axis direction of the vapor deposition source 60 with respect to the control plate unit 80 is determined.

Next, it is determined whether or not the amount of positional offset in the X axis direction measured in step S15 is less than or equal to a preset threshold value (step S16). The threshold value can be set by, for example, taking into consideration the allowable range for the amounts of positional offset in the X axis direction of the vapor deposition source openings 61 with respect to the control plates 81.

If it is determined that the amount of positional offset exceeds the threshold value, the required amount of correction is calculated (step S17). Specifically, the amount of movement in the X axis direction of the vapor deposition source 60 that is required to reduce the amount of positional offset to the threshold value or less is calculated.

Next, the vapor deposition source 60 is moved in the X axis direction according to the amount of correction determined in step S17 by using the linear drive mechanism 121 (step S18).

After that, the procedure returns to step S15, where the amount of positional offset in the X axis direction of the vapor deposition source 60 with respect to the control plate unit 80 is measured.

If it is determined in step S16 that the amount of positional offset measured in step S15 is less than or equal to the threshold value, the difference in the amount of thermal expansion in the X axis direction between the vapor deposition source 60 and the control plate unit 80 is measured (step S19). Specifically, the positions of the first alignment marks 201 are detected by the first recognition units 211 and then compared with the positions detected in step S11, and thereby the amount of thermal expansion in the X axis direction of the vapor deposition source 60 is determined. Likewise, the positions of the second alignment marks 202 are detected by the second recognition units 212 and then compared with the positions detected in step S11, and thereby the amount of thermal expansion in the X axis direction of the control plate unit 80 is determined. Then, from the amount of thermal expansion of the vapor deposition source 60 and the amount of thermal expansion of the control plate unit 80, the difference in the amount of thermal expansion in the X axis direction between the vapor deposition source 60 and the control plate unit 80 is determined.

Next, it is determined whether or not the difference in the amount of thermal expansion measured in step S19 is less than or equal to a preset threshold value (step S20). The threshold value can be set by, for example, taking into consideration the allowable range for the amounts of positional offset in the X axis direction of the vapor deposition source openings 61 with respect to the control plates 81.

If it is determined that the difference in the amount of thermal expansion exceeds the threshold value, the required amount of correction is calculated (step S21). Specifically, the rotation angle of the vapor deposition source 60 about the central axis 125a of rotation that is required to reduce the difference in the amount of thermal expansion to the threshold value or less is calculated.

Next, the vapor deposition source 60 is rotated according to the amount of correction determined in step S21 by using the rotary drive mechanism 125 (step S22).

After that, the procedure returns to step S19, where the difference in the amount of thermal expansion in the X axis direction between the vapor deposition source 60 and the control plate unit 80 is measured.

If it is determined in step S20 that the difference in the amount of thermal expansion measured in step S19 is less than or equal to the threshold value, the shutter 95 is opened (step S23), the substrate 10 is transferred (step S24), and a coating film 90 is formed on the deposition surface 10e of the substrate 10 (see FIG. 12).

As described above, according to Embodiment 1, a difference in the amount of thermal expansion in the X axis direction between the vapor deposition source 60 and the control plate unit 80, which occurred during the heating process from room temperature to the vapor deposition temperature, is detected and corrected before the coating film 90 is formed, and therefore the amounts of positional offset in the X axis direction of the vapor deposition source openings 61 with respect to the control plates 81 caused due to the difference in the amount of thermal expansion can be reduced. As a result, it is possible to solve a problem (see FIG. 10B) encountered with the second new vapor deposition method in that the coating film 990 formed on the substrate 10 is positionally offset in X axis direction due to the occurrence of a difference in the amount of thermal expansion between the vapor deposition source 960 and the control plate unit 980. In other words, according to Embodiment 1, the amount of positional offset in the X axis direction of the coating film 90 formed on the substrate 10 can be reduced.

Furthermore, the amount of positional offset in the X axis direction of the vapor deposition source 60 with respect to the control plate unit 80, which occurred during the heating process from room temperature to the vapor deposition temperature, is detected and corrected before the coating film 90 is formed, and therefore the amounts of positional offset in the X axis direction of the vapor deposition source openings 61 with respect to the control plates 81 can be further reduced. As a result, the amount of positional offset in the X axis direction of the coating film 90 formed on the substrate 10 can be further reduced.

By setting the threshold values used in steps S16 and S20, and the correction values calculated in steps S17 and S21 by also taking into consideration, for example, the processing accuracy of the vapor deposition source 60 and the control plate unit 80, the processing accuracy of the vapor deposition source 60 and the control plate unit 80 can be relaxed. This can reduce the production cost of the vapor deposition source 60 and the control plate unit 80, enabling a reduction in the production cost of the organic EL display device.

In the present embodiment, if the amount of positional offset in the X axis direction of the vapor deposition source 60 with respect to the control plate unit 80 during the heating process from room temperature to the vapor deposition temperature can be reduced to an allowable level by modifying the design or the like, steps S15 to S18 shown in FIG. 13 and the linear drive mechanism 121 shown in FIG. 12 may be omitted.

Embodiment 2

Figure 14:
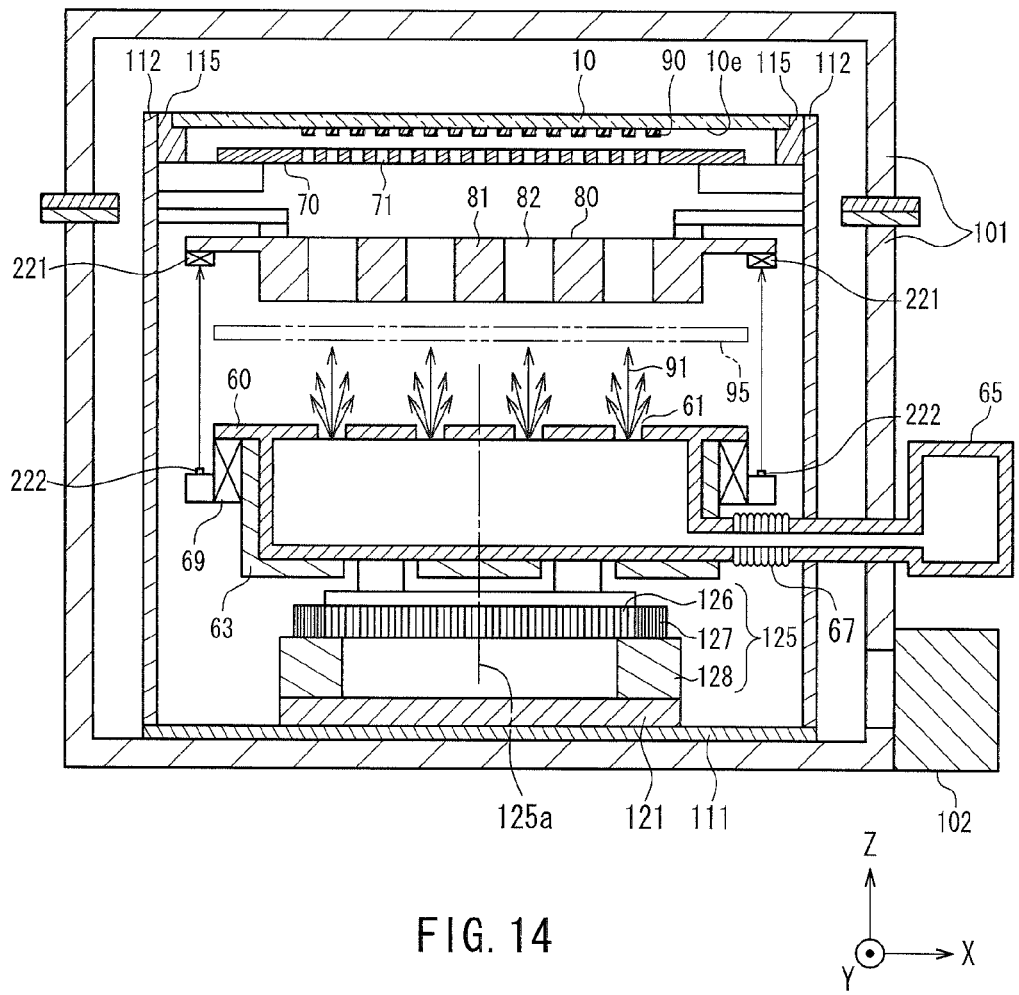
FIG. 14 is a front cross-sectional view of a vapor deposition device according to Embodiment 2 of the present invention as viewed in the scanning direction of a substrate.

FIG. 14 is a front cross-sectional view of a vapor deposition device according to Embodiment 2 of the present invention as viewed in a scanning direction of a substrate 10. In FIG. 14, members that are the same as those shown in FIG. 12 are given the same reference numerals, and redundant descriptions thereof are omitted here. Hereinafter, Embodiment 2 will be described, focusing on the difference from Embodiment 1.

In Embodiment 2, a pair of alignment marks 221 and a pair of recognition units 222 are used instead of the first and second alignment marks 201 and 202 and the first and second recognition units 211 and 212 of Embodiment 1.

The alignment marks 221 are formed on opposite ends in the X axis direction of a control plate unit 80. The recognition units 222 are provided on opposite ends in the X axis direction of a vapor deposition source 60. Each recognition unit 222 is disposed so as to oppose the corresponding alignment mark 221 in the Z axis direction so that the recognition unit 222 can recognize the position of the alignment mark 221. The recognition unit 222 is provided on a heat shielding plate 69 provided on the vapor deposition source 60 or the heater 63, so as to prevent the recognition unit 222 from being heated by the vapor deposition source 60 or the heater 63. The heat shielding plate 69 can be, for example, a cooling plate internally provided with a water cooling pipe or the like, as with the heat shielding plate 69 of Embodiment 1.

It is preferable that the alignment marks 221 and the recognition units 222 are disposed at positions that cannot be seen directly from the vapor deposition source openings 61, in order to make it difficult for the vapor deposition particles 91 discharged from the vapor deposition source openings 61 to adhere thereto. Where necessary, it may be possible to provide protection plates (or shielding plates) for preventing the vapor deposition particles 91 from adhering to the alignment marks 221 and the recognition units 222.

The configurations of the alignment marks 221 and the recognition units 222 may be the same as those of the first and second alignment marks 201 and 202 and the first and second recognition units 211 and 212 described in Embodiment 1.

In contrast to this example, it is also possible to form the alignment marks 221 on the opposite ends in the X axis direction of the vapor deposition source 60 and provide the recognition units 222 on the opposite ends in the X axis direction of the control plate unit 80. In this case, the possibility that the recognition units 222 are exposed to high temperatures is reduced, and thus the heat shielding plates 69 may be omitted.

Vapor deposition using the vapor deposition device according to Embodiment 2 can be performed in the same manner as in FIG. 13 described in Embodiment 1. It should be noted, however, steps S11, S15 and S19 are changed as follows.

Specifically, in Embodiment 1, in step S11 shown in FIG. 13, the absolute positions of the first and second alignment marks 201 and 202 in the XY coordinate are detected. In contrast, in Embodiment 2, in step S11, it is only necessary to recognize the alignment marks 221 by using the recognition units 222.

In step S15 of Embodiment 2, the alignment marks 221 are recognized by the recognition units 222, then the positions thereof are compared with the positions of the alignment marks 221 recognized in step S11, and thereby the amount of positional offset in the X axis direction of the vapor deposition source 60 with respect to the control plate unit 80 is determined.

Also, in step S19 of Embodiment 2, the alignment marks 221 are recognized by the recognition units 222, then the positions thereof are compared with the positions of the alignment marks 221 identified in step S11, and thereby the difference in the amount of thermal expansion in the X axis direction between the vapor deposition source 60 and the control plate unit 80 is determined.

Vapor deposition can be performed in the same manner as in FIG. 13 described in Embodiment 1, except for the above difference.

According to Embodiment 2, the recognition units 222 and the alignment marks 221 are provided respectively on the vapor deposition source 60 and the control plate unit 80, and thus the measurement of the absolute positions of the first and second alignment marks in the XY coordinate performed in step S11 shown in FIG. 13 of Embodiment 1 is unnecessary. That is, the difference in the amount of thermal expansion in the X axis direction between the vapor deposition source 60 and the control plate unit 80 and the amount of positional offset in the X axis direction therebetween can be determined by comparing the positions of the alignment marks 221 in the images captured by the recognition units 222 between room temperature and elevated temperature. Accordingly, computation can be simplified.

Also, the required number of recognition units and the required number of alignment marks can be reduced as compared to those of Embodiment 1, and thus the cost of the device can be reduced.

Embodiment 2 is the same as Embodiment 1 except for the above difference, and has the same effects as those described in Embodiment 1.

Embodiment 3

Figure 15:
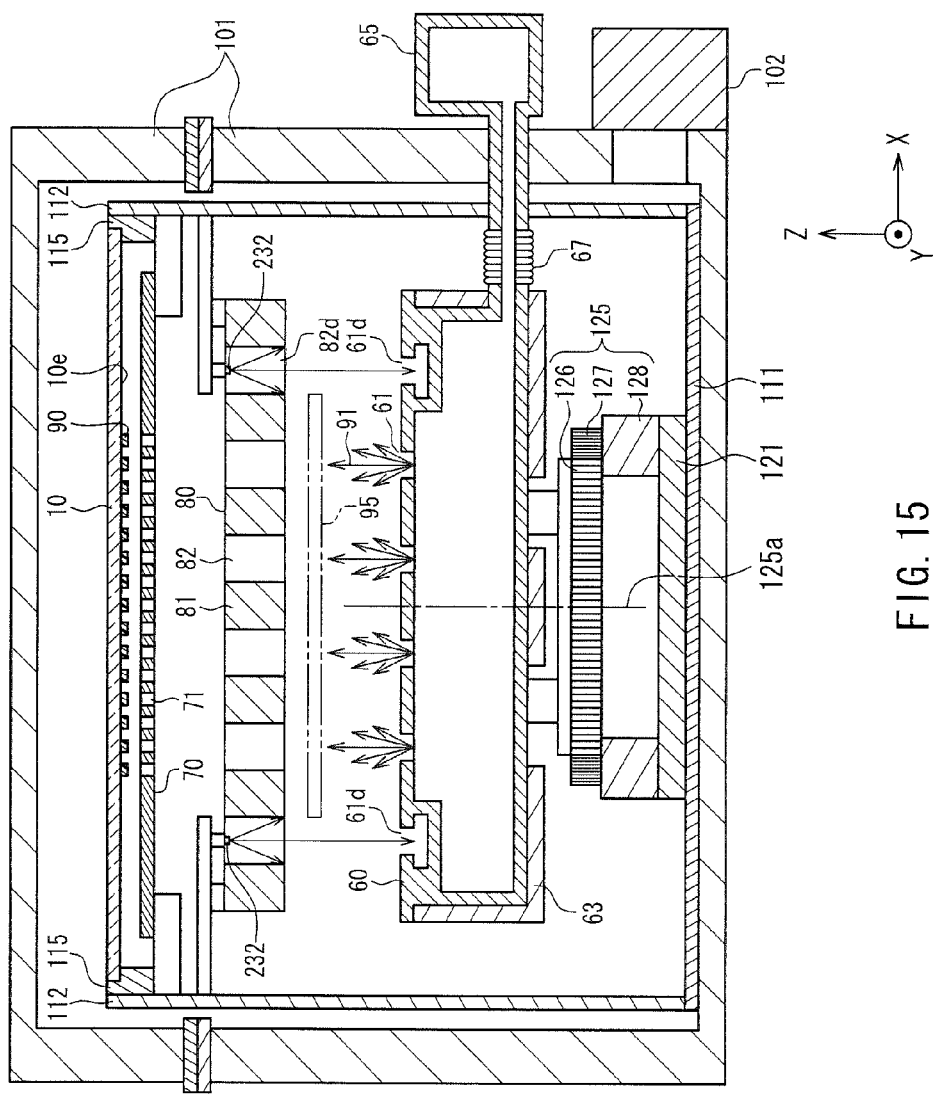
FIG. 15 is a front cross-sectional view of a vapor deposition device according to Embodiment 3 of the present invention as viewed in the scanning direction of a substrate.

FIG. 15 is a front cross-sectional view of a vapor deposition device according to Embodiment 3 of the present invention as viewed in a scanning direction of a substrate 10. In FIG. 15, members that are the same as those shown in FIG. 12 are given the same reference numerals, and redundant descriptions thereof are omitted here. Hereinafter, Embodiment 3 will be described, focusing on the difference from Embodiment 1.

In Embodiment 3, a pair of recognition units 232 are used instead of the first and second recognition units 211 and 212 of Embodiment 1. The pair of recognition units 232 are held by arms that extend from the frame side plates 112 and that hold a control plate unit 80.

A pair of dummy control spaces 82d are formed on outward sides in the X axis direction of the region of the control plate unit 80 in which a plurality of control spaces 82 are formed. It is preferable that the dummy control spaces 82d are formed at positions where the vapor deposition particles 91 discharged from the vapor deposition source openings 61 hardly enter. Even if vapor deposition particles 91 enter the dummy control spaces 82d, the vapor deposition particles 91 do not contribute to formation of the coating film 90.

A pair of dummy vapor deposition source openings 61d are formed on outward sides in the X axis direction of the region of the vapor deposition source 60 in which a plurality of vapor deposition source openings 61 are formed. No vapor deposition particles 91 are discharged from the dummy vapor deposition source openings 61d.

The recognition unit 232, the dummy control space 82d and the dummy vapor deposition source opening 61d are arranged in this order from the upper side to the lower side substantially along a straight line parallel to the Z axis. The recognition unit 232 recognizes, with a single view, the opening edge located under the dummy control space 82d and the dummy vapor deposition source opening 61d. In Embodiment 3, the opening edge of the dummy control space 82d and the dummy vapor deposition source opening 61d function as alignment marks. Accordingly, in Embodiment 3, the first and second alignment marks 201 and 202 of Embodiment 1 are not used.

The recognition units 232 are disposed above the dummy control spaces 82d, and thus the vapor deposition particles 91 do not easily adhere thereto. Where necessary, it may be possible to provide protection plates (or shielding plates) for preventing the vapor deposition particles 91 from adhering to the recognition units 232.

The configuration of the recognition units 232 may be the same as that of the first and second recognition units 211 and 212 described in Embodiment 1.

Vapor deposition using the vapor deposition device according to Embodiment 3 can be performed in the same manner as in FIG. 13 described in Embodiment 1. It should be noted, however, steps S11, S15 and S19 are changed as follows.

Specifically, in Embodiment 1, in step S11 shown in FIG. 13, the absolute positions of the first and second alignment marks 201 and 202 in the XY coordinate are detected. In contrast, in Embodiment 3, in step S11, the absolute positions of the opening edge of the dummy control space 82d and the dummy vapor deposition source opening 61d in the XY coordinate are detected simultaneously by the common recognition unit 232.

In step S15 of Embodiment 3, the amount of positional offset in the X axis direction of the vapor deposition source 60 with respect to the control plate unit 80 is measured in the following manner. Specifically, the position of the dummy vapor deposition source opening 61d is detected by the recognition unit 232 and then compared with the position of the dummy vapor deposition source opening 61d detected in step S11, and thereby the amount of shift of the central position in the X axis direction of the vapor deposition source 60 is determined. Also, the position of the opening edge of the dummy control space 82d is detected by the recognition unit 232 and then compared with the position of the opening edge of the dummy control space 82d detected in step S11, and thereby the amount of shift of the central position in the X axis direction of the control plate unit 80 is determined. Then, from the amount of shift of the central position of the vapor deposition source 60 and the amount of shift of the central position of the control plate unit 80, the amount of positional offset in the X axis direction of the vapor deposition source 60 with respect to the control plate unit 80 is determined.

Also, in step S19 of Embodiment 3, the difference in the amount of thermal expansion in the X axis direction between the vapor deposition source 60 and the control plate unit 80 is measured in the following manner. Specifically, the position of the dummy vapor deposition source opening 61d is detected by the recognition unit 232, and then compared with the position of the dummy vapor deposition source openings 61d detected in step S11, and thereby the amount of thermal expansion in the X axis direction of the vapor deposition source 60 is determined. Also, the position of the opening edge of the dummy control space 82d is detected by the recognition unit 232 and then compared with the position of the opening edge of the dummy control space 82d detected in step S11, and thereby the amount of thermal expansion in the X axis direction of the control plate unit 80 is determined. Then, from the amount of thermal expansion of the vapor deposition source 60 and the amount of thermal expansion of the control plate unit 80, the difference in the amount of thermal expansion in the X axis direction between the vapor deposition source 60 and the control plate unit 80 is determined.

Vapor deposition can be performed in the same manner as in FIG. 13 described in Embodiment 1, except for the above difference.

According to Embodiment 3, the opening edge of the dummy control space 82d and the dummy vapor deposition source opening 61d that function as alignment marks are detected by the common recognition unit 232. Accordingly, as compared to Embodiment 1 in which the first alignment marks 201 provided on the control plate unit 80 and the second alignment marks 202 provided on the vapor deposition source 60 are respectively recognized by separate recognition units, the amount of positional offset in the X axis direction between the vapor deposition source 60 and the control plate unit 80 and the difference in the amount of thermal expansion in the X axis direction therebetween can be determined with higher accuracy. As a result, the amount of positional offset in the X axis direction of the coating film 90 formed on the substrate 10 can be further reduced.

Also, the number of recognition units can be reduced as compared to that of Embodiment 1, and thus the cost of the device can be reduced.

The dummy control spaces 82 and the dummy vapor deposition source openings 61d can be formed in the same manner as the control spaces 82 and the vapor deposition source openings 61, and thus it is unnecessary to perform a new step of forming the dummy control spaces 82 and the dummy vapor deposition source openings 61d. Accordingly, with Embodiment 3, the production of the device is easier and the cost can be reduced as compared to Embodiment 1 in which the alignment marks 201 and 202 are formed.

Embodiment 3 is the same as Embodiment 1 except for the above difference, and has the same effects as those described in Embodiment 1.

Embodiment 4

In Embodiment 1, as described with reference to FIG. 13, the difference in the amount of thermal expansion in the X axis direction between the vapor deposition source 60 and the control plate unit 80 and the amount of positional offset in the X axis direction therebetween, which occurred during the heating process from room temperature to the vapor deposition temperature, is corrected before vapor deposition onto the substrate is started. In contrast, in Embodiment 4, the difference in the amount of thermal expansion in the X axis direction between the vapor deposition source 60 and the control plate unit 80 and the amount of positional offset in the X axis direction therebetween, which occur from the start to the end of vapor deposition onto the substrate, are further corrected. Hereinafter, Embodiment 4 will be described, focusing on the difference from Embodiment 1.

Figure 16:
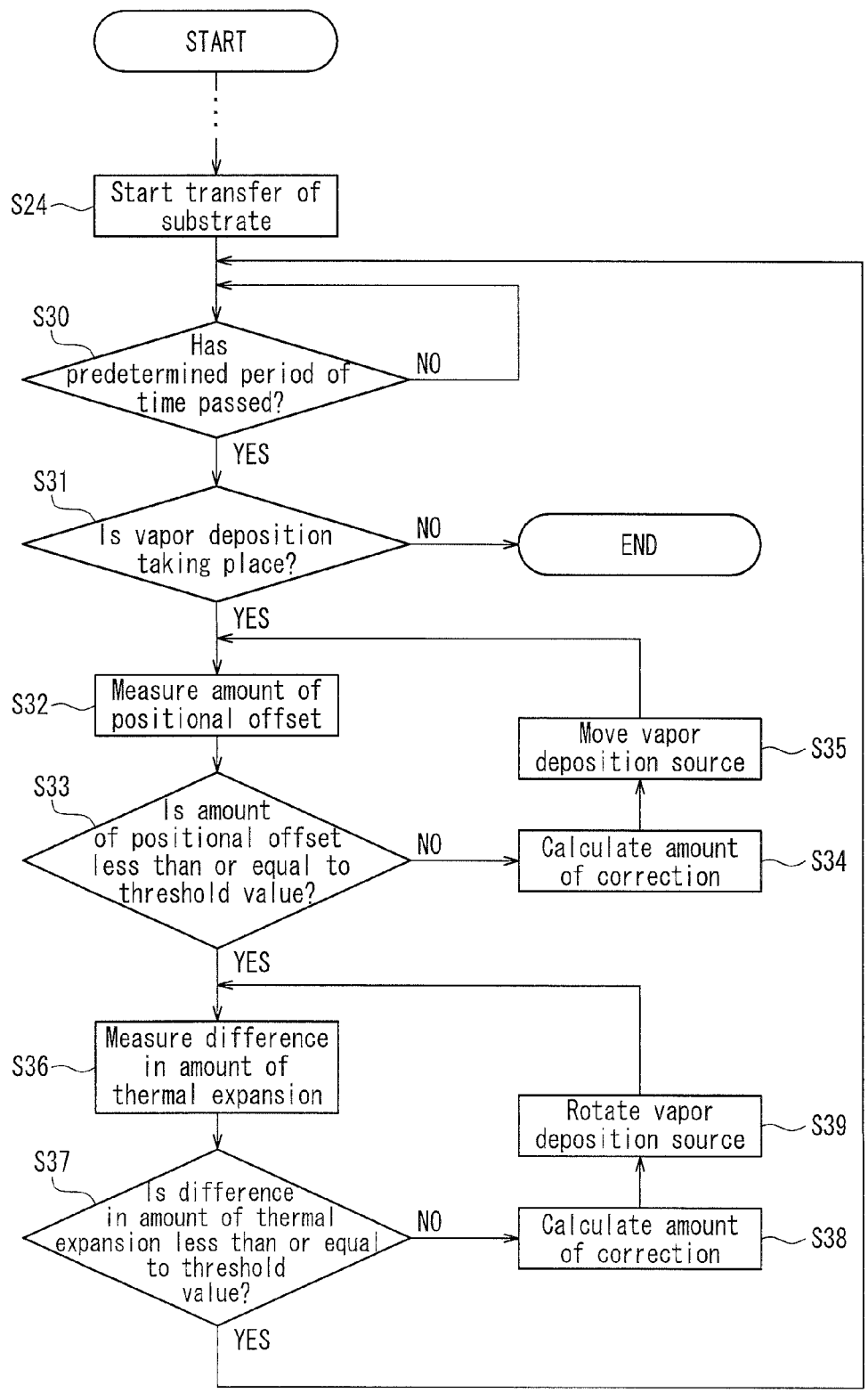
FIG. 16 is a flowchart of a vapor deposition method using a vapor deposition device according to Embodiment 4 of the present invention.

FIG. 16 is a flowchart of a vapor deposition method using a vapor deposition device according to Embodiment 4 of the present invention. In FIG. 16, the steps from "START" to step S24 are the same as those shown in FIG. 13, and thus the steps before step S24 are not illustrated. The vapor deposition method of Embodiment 4 after step S24, or in other words, after the start of vapor deposition will be described with reference to FIG. 16.

In step S30, it is determined whether or not a predetermined period of time has passed. The predetermined period of time is a time interval during which the difference in the amount of thermal expansion and the amount of positional offset are corrected, and can be set to any value.

If it is confirmed in step S30 that the predetermined period of time has passed, then in step 21, it is determined whether or not the vapor deposition onto the substrate is taking place.

If it is determined that the vapor deposition onto the substrate is taking place, the amount of positional offset in the X axis direction of the vapor deposition source 60 with respect to the control plate unit 80 is measured (step S31). The measurement of the amount of positional offset can be performed in the same manner as in step S15 shown in FIG. 13.

Next, it is determined whether or not the amount of positional offset in the X axis direction measured in step S31 is less than or equal to a preset threshold value (step S32). The threshold value can be set by, for example, taking into consideration the allowable range for the amounts of positional offset in the X axis direction of the vapor deposition source openings 61 with respect to the control plates 81. For example, the value used in step S16 shown in FIG. 13 can be used.

If it is determined that the amount of positional offset exceeds the threshold value, the required amount of correction is calculated (step S34). The calculation of the amount of correction can be performed in the same manner as in step S17 shown in FIG. 13.

Next, the vapor deposition source 60 is moved in the X axis direction according to the amount of correction determined in step S34 by using the linear drive mechanism 121 (step S35).

After that, the procedure returns to step S32, where the amount of positional offset in the X axis direction of the vapor deposition source 60 with respect to the control plate unit 80 is measured.

If it is determined in step S33 that the amount of positional offset measured in step S32 is less than or equal to the threshold value, the difference in the amount of thermal expansion in the X axis direction between the vapor deposition source 60 and the control plate unit 80 is measured (step S36). The measurement of the difference in the amount of thermal expansion can be performed in the same manner as in step S19 shown in FIG. 13.

Next, it is determined whether or not the difference in the amount of thermal expansion measured in step S36 is less than or equal to a preset threshold value (step S37). The threshold value can be set by, for example, taking into consideration the allowable range for the amounts of positional offset in the X axis direction of the vapor deposition source openings 61 with respect to the control plates 81. For example, the value used in step S20 shown in FIG. 13 can be used.

If it is determined that the difference in the amount of thermal expansion exceeds the threshold value, the required amount of correction is calculated (step S38). The calculation of the amount of correction can be performed in the same manner as in step S21 shown in FIG. 13.

Next, the vapor deposition source 60 is rotated according to the amount of correction determined in step S38 by using the rotary drive mechanism 125 (step S39).

After that, the procedure returns to step S36, where the difference in the amount of thermal expansion in the X axis direction between the vapor deposition source 60 and the control plate unit 80 is measured.

If it is determined in step S37 that the difference in the amount of thermal expansion measured in step S36 is less than or equal to the threshold value, the procedure returns to step S30.

If it is determined in step S31 that the vapor deposition onto the substrate is not taking place, the shutter 95 is closed, and the vapor deposition step ends.

As described above, according to Embodiment 4, the difference in the amount of thermal expansion in the X axis direction between the vapor deposition source 60 and the control plate unit 80 is detected and corrected at a predetermined time interval after vapor deposition is started, and therefore the amounts of positional offset in the X axis direction of the vapor deposition source openings 61 with respect to the control plates 81, caused due to the difference in the amount of thermal expansion can be reduced. As a result, it is possible to solve a problem (see FIG. 10B) encountered with the second new vapor deposition method in that the coating film 990 formed on the substrate 10 is positionally offset in X axis direction due to the occurrence of a difference in the amount of thermal expansion between the vapor deposition source 960 and the control plate unit 980. In other words, according to Embodiment 4, the amount of positional offset in the X axis direction of the coating film 90 formed on the substrate 10 can be further reduced.

Furthermore, the amount of positional offset in the X axis direction of the vapor deposition source 60 with respect to the control plate unit 80 is detected and corrected at a predetermined time interval after vapor deposition is started, and therefore the amounts of positional offset in the X axis direction of the vapor deposition source openings 61 with respect to the control plates 81 can be further reduced. As a result, the amount of positional offset in the X axis direction of the coating film 90 formed on the substrate 10 can be further reduced.

As described above, with Embodiment 4, even when the temperatures of the vapor deposition source 60 and the control plate unit 80 change after vapor deposition has started, the positional offset in the X axis direction of the coating film 90 due to such a temperature change can be suppressed.

In FIG. 16, step S30 can be omitted. In this case, the difference in the amount of thermal expansion in the X axis direction and the amount of positional offset in the X axis direction can be constantly detected and corrected, and therefore the amount of positional offset in the X axis direction of the coating film 90 can be further reduced. On the other hand, by providing step S30, the load required for computation processing can be reduced.

In Embodiment 4, if the amount of positional offset in the X axis direction of the vapor deposition source 60 with respect to the control plate unit 80 during the vapor deposition step after vapor deposition is started can be reduced to an allowable level by modifying the design or the like, steps S32 to S35 shown in FIG. 16 may be omitted.

In the above description, a configuration in which the difference in the amount of thermal expansion and the amount of positional offset are corrected after the start of vapor deposition is applied in Embodiment 1, but it can be applied to Embodiments 2 and 3 as well. In this case, steps S32 and S36 are changed in the same manner as with the steps S15 and 19 described in Embodiments 2 and 3.

Embodiments 1 to 4 given above are merely illustrative, and the present invention is not limited to these embodiments and can be changed as appropriate.

For example, if the substrate 10 has a large dimension in the X axis direction, a plurality of vapor deposition units 50 as shown in FIG. 11 may be arranged at different positions in the X axis direction and in the Y axis direction.

In Embodiments 1 to 4 given above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 to 4 given above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

INDUSTRIAL APPLICABILITY

There is no particular limitation on the fields to which the vapor deposition device and vapor deposition method of the present invention can be applied, and the present invention is preferably used to form light emitting layers for use in organic EL display devices.

DESCRIPTION OF SYMBOLS

10 Substrate
10e Deposition Surface
20 Organic EL Element
23R, 23G, 23B Light Emitting Layer
50 Vapor Deposition Unit
60 Vapor Deposition Source
61 Vapor Deposition Source Opening
70 Vapor Deposition Mask
71 Mask Opening
80 Control Plate Unit
81 Control Plate
82 Control Space
90 Coating Film
91 Vapor Deposition Particle
95 Shutter
115 Linear Transfer Mechanism (moving mechanism)
121 Linear Drive Mechanism
125 Rotary Drive Mechanism
201, 202, 221 Alignment marks
211, 212, 222, 232 Recognition units

The invention claimed is:

1. A vapor deposition method for forming a coating film having a predetermined pattern on a substrate, the method comprising
   a vapor deposition step of forming the coating film by causing vapor deposition particles to adhere onto the substrate,
   wherein the vapor deposition step is a step in which with the use of a vapor deposition unit including a vapor deposition source having a plurality of vapor deposition source openings that discharge the vapor deposition particles, a vapor deposition mask disposed between the plurality of vapor deposition source openings and the substrate, and a control plate unit that includes a plurality of control plates disposed along a first direction orthogonal to a normal line direction of the substrate and that is disposed between the vapor deposition source and the vapor deposition mask, the vapor deposition particles that have passed through a space between the control plates adjacent in the first direction and a plurality of mask openings formed in the vapor deposition mask are caused to adhere onto the substrate while one of the substrate and the vapor deposition unit is moved relative to the other along a second direction orthogonal to the normal line direction of the substrate and the first direction in a state in which the substrate and the vapor deposition mask are spaced apart at a fixed interval, and
   the method further comprises: a step of detecting a difference in an amount of thermal expansion in the first direction between the vapor deposition source and the control plate unit; and
   a step of correcting the difference in the amount of thermal expansion.

2. The vapor deposition method according to claim 1, wherein the difference in the amount of thermal expansion is corrected by rotating the vapor deposition source within a plane parallel to the first direction and the second direction.

3. The vapor deposition method according to claim 2, wherein the vapor deposition source is rotated about a central axis of rotation that passes through a central position in the first direction of the vapor deposition source.

4. The vapor deposition method according to claim 1, wherein the step of detecting the difference in the amount of thermal expansion and the step of correcting the difference in the amount of thermal expansion are performed before the coating film is formed on the substrate.

5. The vapor deposition method according to claim 1, wherein the step of detecting the difference in the amount of thermal expansion and the step of correcting the difference in the amount of thermal expansion are performed while the coating film is formed on the substrate.

6. The vapor deposition method according to claim 1, wherein the difference in the amount of thermal expansion is detected by simultaneously observing the vapor deposition source and the control plate unit from a common location that is other than the vapor deposition source and the control plate unit.

7. The vapor deposition method according to claim 1, wherein the difference in the amount of thermal expansion is detected by observing one of the vapor deposition source and the control plate unit from the other.

8. The vapor deposition method according to claim 1, further comprising:
a step of detecting an amount of positional offset in the first direction between the vapor deposition source and the control plate unit; and
a step of correcting the amount of positional offset.

9. The vapor deposition method according to claim 8, wherein the amount of positional offset is corrected by moving the vapor deposition source in the first direction.

10. The vapor deposition method according to claim 8, wherein the amount of positional offset is corrected before the difference in the amount of thermal expansion is corrected.

11. The vapor deposition method according to claim 8, wherein the step of detecting the amount of positional offset and the step of correcting the amount of positional offset are performed before the coating film is formed on the substrate.

12. The vapor deposition method according to claim 8, wherein the step of detecting the amount of positional offset and the step of correcting the amount of positional offset are performed while the coating film is formed on the substrate.

13. The vapor deposition method according to claim 8, wherein the amount of positional offset is detected by simultaneously observing the vapor deposition source and the control plate unit from a common location that is other than the vapor deposition source and the control plate unit.

14. The vapor deposition method according to claim 8, wherein the amount of positional offset is detected by observing one of the vapor deposition source and the control plate unit from the other.

15. The vapor deposition method according to claim 1, wherein the coating film is a light emitting layer for an organic EL element.

16. A vapor deposition device that forms a coating film having a predetermined pattern on a substrate, the device comprising:
a vapor deposition unit including a vapor deposition source having a plurality of vapor deposition source openings that discharge vapor deposition particles for forming the coating film, a vapor deposition mask disposed between the plurality of vapor deposition source openings and the substrate, and a control plate unit that includes a plurality of control plates disposed along a first direction orthogonal to a normal line direction of the substrate and that is disposed between the vapor deposition source and the vapor deposition mask;
a moving mechanism that moves one of the substrate and the vapor deposition unit relative to the other along a second direction orthogonal to the normal line direction of the substrate and the first direction in a state in which the substrate and the vapor deposition mask are spaced apart at a fixed interval;
a means for detecting a difference in an amount of thermal expansion in the first direction between the vapor deposition source and the control plate unit; and
a means for correcting the difference in the amount of thermal expansion.

17. The vapor deposition device according to claim 16, wherein the means for correcting the difference in the amount of thermal expansion includes a rotary drive mechanism that rotates the vapor deposition source within a plane parallel to the first direction and the second direction.

18. The vapor deposition device according to claim 16, further comprising:
a means for detecting an amount of positional offset in the first direction between the vapor deposition source and the control plate unit; and
a means for correcting the amount of positional offset.

19. The vapor deposition device according to claim 18, wherein the means for correcting the amount of positional offset includes a linear drive mechanism that moves the vapor deposition source in the first direction.

20. The vapor deposition device according to claim 18, wherein the means for detecting the amount of positional offset includes a member that is common to the means for correcting the difference in the amount of thermal expansion.

* * * * *